United States Patent
Wu et al.

(10) Patent No.: US 7,180,089 B2
(45) Date of Patent: Feb. 20, 2007

(54) RECONFIGURABLE ORGANIC LIGHT-EMITTING DEVICE AND DISPLAY APPARATUS EMPLOYING THE SAME

(75) Inventors: Chung-Chih Wu, Taipei (TW); Chieh-Wei Chen, Taipei (TW); Ting-Yi Cho, Taipei (TW)

(73) Assignee: National Taiwan University, Taipei (TW)

( * ) Notice: Subject to any disclaimer, the term of this patent is extended or adjusted under 35 U.S.C. 154(b) by 72 days.

(21) Appl. No.: 10/642,745

(22) Filed: Aug. 19, 2003

(65) Prior Publication Data

US 2005/0040392 A1 Feb. 24, 2005

(51) Int. Cl.
*H01L 29/08* (2006.01)
*H01L 29/18* (2006.01)
*H01L 29/20* (2006.01)

(52) U.S. Cl. .............. 257/40; 257/88; 257/89

(58) Field of Classification Search ............ 257/40, 257/79, 88, 89, 103
See application file for complete search history.

(56) References Cited

U.S. PATENT DOCUMENTS

| | | | |
|---|---|---|---|
| 5,701,055 A | 12/1997 | Nagayama et al. | |
| 5,742,129 A | 4/1998 | Nagayama et al. | |
| 5,909,081 A | 6/1999 | Eida et al. | |
| 5,952,037 A | 9/1999 | Nagayama et al. | |
| 6,114,088 A | 9/2000 | Wolk et al. | |
| 6,373,182 B1 | 4/2002 | Kloba et al. | |

FOREIGN PATENT DOCUMENTS

TW 521535 8/2001

*Primary Examiner*—Hung Vu
(74) *Attorney, Agent, or Firm*—Birch, Stewart, Kolasch & Birch, LLP

(57) ABSTRACT

A reconfigurable organic light-emitting device and a display apparatus employing the organic light-emitting device, wherein the reconfigurable organic light-emitting device includes at least two organic light-emitting layers and at least one high-energy-gap carrier-blocking layer. The at least one high-energy-gap carrier-blocking layer is formed between the organic light-emitting layers. The structure of the reconfigurable organic light-emitting device can be reconfigured through heating, and the reconfigurable organic light-emitting device may thus emit light characteristic of one layer of the at least two organic light-emitting layers, after a bias voltage is applied on the upper electrode and the lower electrode of the reconfigurable organic light-emitting device. The heating may be performed with a built-in resistive heating source, an external heating source or a light-beam. By employing the reconfigurable organic light-emitting device, a fixed-pattern, passive-matrix, or active-matrix display apparatus of multi-color or full-color may further be fabricated.

10 Claims, 24 Drawing Sheets

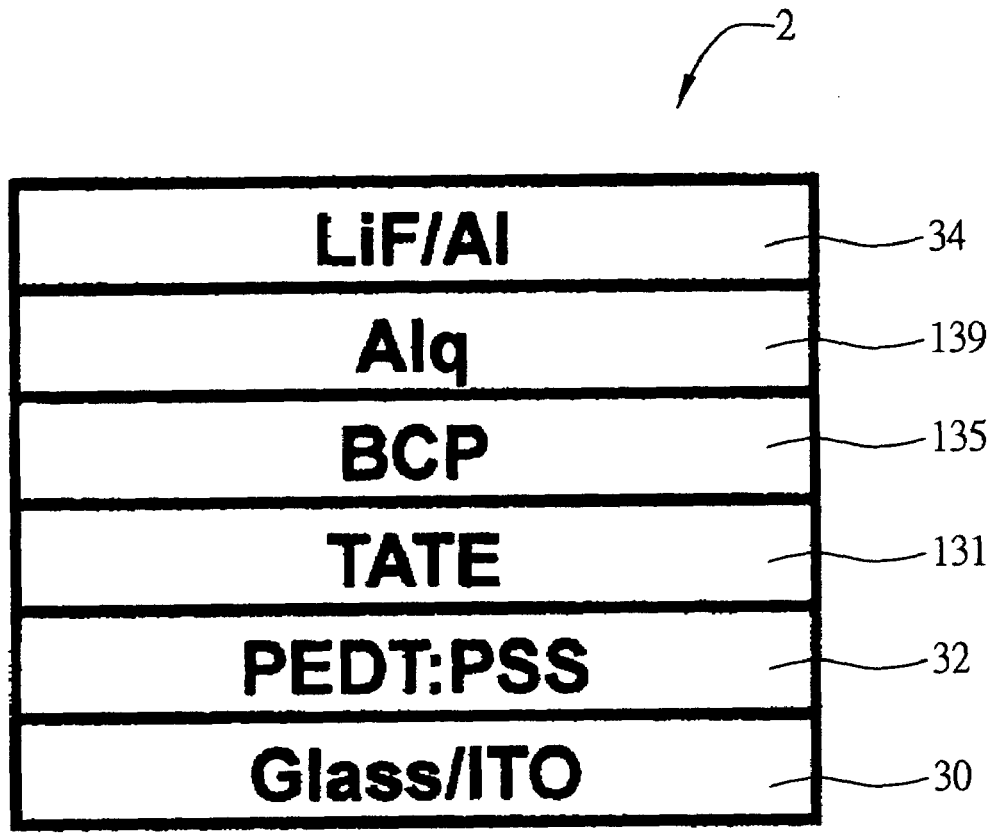
FIG. 3
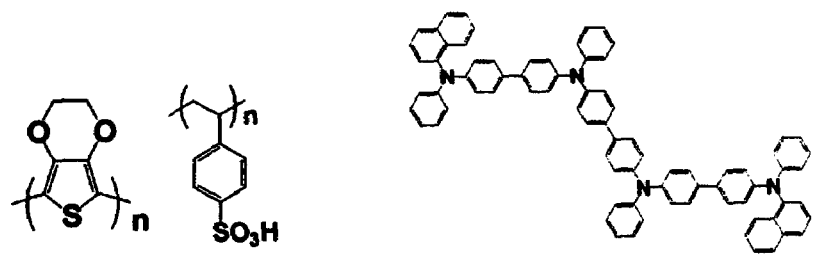
PEDT:PSS
FIG. 4a
TATE
FIG. 4b
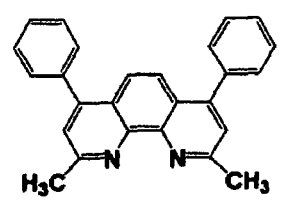
BCP
FIG. 4c
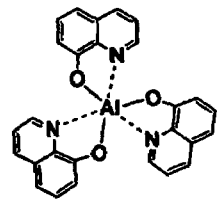
Alq
FIG. 4d

PEDT:PSS

TATE

TAZ

Alq

BCP

DCJTB

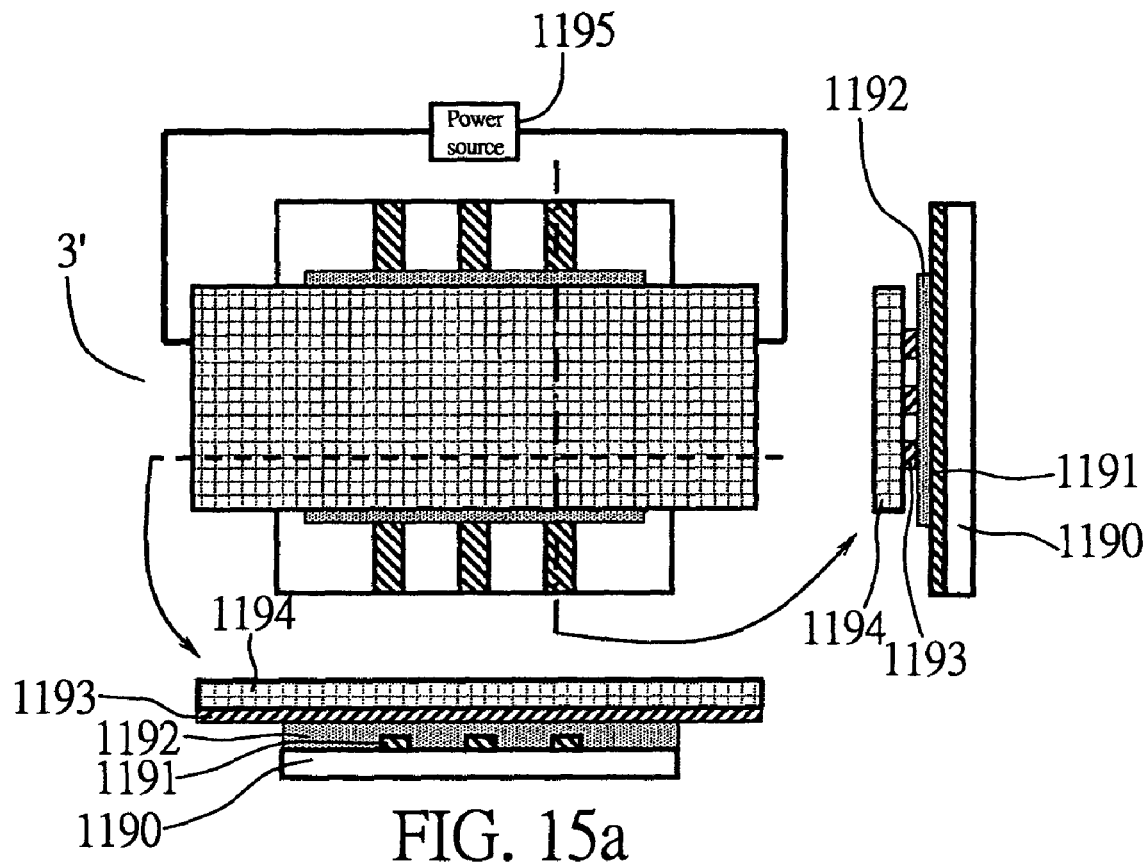
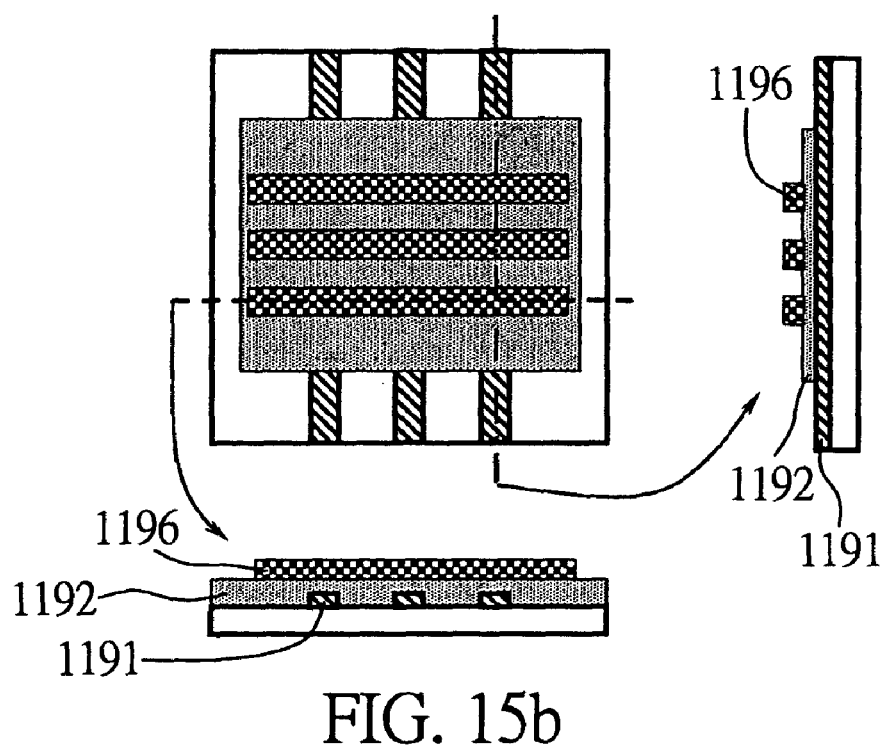
FIG. 15a
FIG. 15b

PEDT:PSS

T-Spiro

Alq

BCP

RECONFIGURABLE ORGANIC LIGHT-EMITTING DEVICE AND DISPLAY APPARATUS EMPLOYING THE SAME

FIELD OF THE INVENTION

This invention relates to generally organic light-emitting devices and display apparatuses employing the same, and, more specifically, to a reconfigurable organic light-emitting device and a display apparatus which employs the reconfigurable organic light-emitting device.

BACKGROUND OF THE INVENTION

The earliest organic light-emitting device (OLED) has been proposed, in 1963, by Pope et al, who applies a 1000 V voltage to both ends of an anthracene crystal with a thickness of 1 mm and observed light emission. However, the operation voltage is so high that it is not applicable to a flat panel display. The structure and the manufacturing method of the organic light-emitting device nowadays are proposed by C. W. Tang and S. A. VanSlyke of the Eastman Kodak Company. One may manufacture the structure by sequentially depositing non-crystalline thin films of organic materials, with vacuum deposition on a glass substrate that is pre-coated with a transparent electrode (lower electrode) of Indium Tin Oxide (ITO), and lastly depositing a metal electrode (upper electrode) thereon. The operation voltage of the organic light-emitting device manufactured in accordance with the above method is reduced to within 10 volts, which largely enhances its value in practical use. Also, the vacuum deposition method is suitable for mass production of flat panel displays with large display areas. Furthermore, since the organic light-emitting device has the features of fast response, self-emitting and low process temperature, the OLED has been evolved to play a significant role in the industry of flat panel displays.

Referring to FIG. 1, the energy level structure for each layer of the conventional two layer organic light-emitting device 1 is illustrated. As shown in the figure, the organic light-emitting device 1 comprises: an anode 10, a cathode 14, a hole-transport layer (HTL) 101, and an electron-transport layer (ETL) 109. Holes 12 and electrons 16 are injected into the HTL 101 and the ETL 109, respectively, via the anode 10 and the cathode 14. When the electrons 16 and the holes 12 drift respectively to the junction between the HTL 101 and the ETL 109, the electrons 16 and the holes 12 combine to form excitons and then emit light. However, such organic light-emitting device has a fixed structure. Once it is fabricated, the structure may no longer be changed. Thus this kind of organic light-emitting device cannot emit light of various colors but only can emit light of one single color.

Since the organic light-emitting device is one of the major components of a flat panel display, whether the flat panel display can display in full-color depends heavily on whether the organic light-emitting device is capable of emitting full-colors. However, after the conventional organic light-emitting device is fabricated, its emission spectrum and device characteristics are fixed. To enable the flat panel display to display in full-color, one of the following methods must be employed: (1) fabricating organic light-emitting devices that emit red, green and blue light, respectively, on a substrate so as to form an array of color pixels; (2) fabricating an array of organic light-emitting devices that emit white light or single-color light on one substrate, and incorporating a color control or conversion array previously fabricated on the same or another substrate so as to achieve a full-color display.

In order to achieve a full-color display by the aforementioned method (1), Nagayama et al. have disclosed a precise shadow-mask alignment method in U.S. Pat. No. 5,701,055, No. 5,742,129, No. 5,952,037 and No. 6,373,182 B1. The precise shadow-mask alignment method is used for fabricating organic light-emitting devices of small molecules in high vacuum. In order to fabricate independent organic light-emitting devices that emit red, green and blue light on the same substrate in sequence, one may carry it out by the precise shadow-mask and alignment method in a vacuum or vapor deposition process. The full-color display is achieved by vacuum depositing organic light-emitting devices with different structures that emit different colors in various regions. However, the employment of this method would encounter problems such as shadow-mask alignment errors, vapor deposition shadowing errors during vapor deposition, difficulty in fabricating shadow masks with small openings, insufficient mechanical strength in large-area shadow masks, and the cleaning of the masks. These problems would reduce the resolutions and yields of the display fabricated with this method.

In order to achieve a full-color display by the aforementioned method (1), Wolk et al. have disclosed a method of thermal transfer of organic materials in U.S. Pat. No. 6,114,088. The method of thermal transfer of organic materials comprises fabricating a layer of organic material on a substrate having a light-to-heat conversion layer, and locally increasing the temperature on the light-to-heat conversion layer by shining light thereon, so as to change the adhesion between the interfaces of different materials corresponding to the temperature change, and to induce thermal transfer. The locally heated region of the organic material layer is then transferred from the original substrate to another substrate for display fabrication. In order to fabricate a full-color display, the organic material layers of red, green and blue colors are sequentially transferred to different pixel locations of the substrate. However, the employment of this method would encounter the problems of complicated manufacturing processes and unsatisfactory yield of the fabricated displays.

In order to achieve a full-color display by the aforementioned method (2), one can make only the organic light-emitting device that emits white light for the entire display. The full-color display is achieved by using the color filter array of red, green and blue colors fabricated thereon so as to filter out different colors in various pixel regions of the display (referring to Kido et al, Science 267, 1332 (1995)). However, the intensity of the light obtained through the color filter, in accordance with this method, would lose more than two thirds of that of the white light emitted by the organic light-emitting device. Thus, the light-emitting efficiency would be largely reduced for the display being fabricated with this method.

In order to achieve a full-color display by the aforementioned method (2), Eida et al. have disclosed an apparatus of organic light-emitting device capable of emitting multi-colors in U.S. Pat. No. 5,909,081. For the entire display, one makes only the organic light-emitting device emitting blue/ultraviolet light. By means of a color conversion array made by phosphorescent or fluorescent material that absorbs blue/ultraviolet light, the blue/ultraviolet light may be converted to blue, green or red light. However, the display of the organic light-emitting device fabricated with this method would encounter the problem of energy conversion efficiency due to the light conversion layer.

SUMMARY OF THE INVENTION

To solve the above mentioned problems, the primary objective of the present invention is to provide a reconfigurable organic light-emitting device, which is applicable to the fabrication of flat panel displays and is capable of simplifying the manufacturing processes of multi-color/full-color displays.

Another objective of the present invention is to provide a reconfigurable organic light-emitting device, the internal structure of which is reconfigurable by means of heating so as to control the color emitted by the reconfigurable organic light-emitting device.

A further objective of the present invention is to employ a reconfigurable organic light-emitting device to fabricate a full-color or multi-color display apparatus. The full-color or multi-color display apparatus may be a fixed-pattern display apparatus, a passive-matrix display apparatus or an active-matrix display apparatus.

In order to achieve the above and other purposes, the reconfigurable organic light-emitting device of the present invention comprises at least two organic light-emitting material layers and at least one higher-energy-gap carrier-blocking layer. The at least one-high-energy-gap carrier-blocking layer is inserted between the at least two organic light-emitting layers. The at least one high-energy-gap carrier-blocking layer has its own glass transition temperature, and the temperature of the at least one high-energy-gap carrier-blocking layer is lower than that of each of the at least two organic light-emitting material layers. When a bias voltage is applied on the reconfigurable organic light-emitting device via an upper electrode and a lower electrode, one of the organic light-emitting layers in the reconfigurable organic light-emitting device with the shortest emission wavelength may emit light of its characteristic spectrum. The reconfigurable organic light-emitting device may be heated so as to reconfigure its structure, one of the organic light-emitting layers in the reconfigurable organic light-emitting device with the second shortest light emission wavelength may emit light of its characteristic spectrum. By continuing the heating process on the reconfigurable organic light-emitting device, the emission color of the reconfigurable organic light-emitting device may sequentially change until reaching the characteristic spectrum of one of the organic light-emitting layers with the longest emission wavelength.

The aforementioned heating means may be realized by fabricating a patterned resistive heating electrode on the device substrate, or by using a patterned external heating source. Additionally, the heating means may also be realized by first fabricating a light-to-heat conversion layer on the reconfigurable organic light-emitting device and then shining a light-beam on the light-to-heat conversion layer so as to accomplish the heating process of the reconfigurable organic light-emitting device.

The reconfigurable organic light-emitting device of the present invention is applicable to the multi-color or full-colored fixed-pattern display apparatus, passive-matrix display apparatus or active-matrix display apparatus.

The fixed-pattern display apparatus is fabricated by means of a resistive heating process or a light-beam heating process. For making the fixed-pattern display apparatus by means of the resistive heating process, the fixed-pattern display apparatus comprises at least a substrate, a lower electrode, a reconfigurable organic light-emitting material structure, and an upper electrode. The display patterns of the fixed-pattern display apparatus may be reconfigured with a patterned heating unit. For making the fixed-pattern display by means of the light-beam heating process, the fixed-pattern display apparatus comprises at least a substrate, a lower electrode, a reconfigurable organic light-emitting layer, an upper electrode and a light-to-heat conversion layer. The light-to-heat conversion layer is exposed to a light beam emitted from a light source to form heated regions, which then form the display patterns in the fixed-pattern display apparatus.

The passive-matrix display apparatus is fabricated by means of a resistive heating process or a light-beam heating process. For making the passive-matrix display by means of the resistive heating process, the passive-matrix display apparatus at least comprises a substrate, a lower electrode, a patterned insulating layer, a reconfigurable organic light-emitting structure, and an upper electrode. By applying a certain amount of current on a heating electrode, color pixels may thus be formed on the display apparatus. For making the passive-matrix display by means of the light-beam heating process, the passive-matrix display at least comprises a substrate, a lower electrode, a reconfigurable organic light-emitting structure, an upper electrode and a light-to-heat conversion layer. The light-to-heat conversion layer is exposed to a light beam emitted from a light source to form heated regions. Through the heating, color pixels are thus formed on the display apparatus.

The active-matrix display apparatus is fabricated by means of a resistive heating process or a light-beam heating process. For heating the active-matrix display by means of the resistive heating process, the active-matrix display apparatus at least comprises a substrate, a first insulating layer, a heating electrode, a second insulating layer, a lower electrode, a reconfigurable organic light-emitting layer, an upper electrode, and a transistor circuit. By applying a certain amount of current on the heating electrode, color pixels are thus formed on the display apparatus. Furthermore, whether the reconfigurable organic light-emitting device emits or not is controlled by the transistor circuit. For fabricating the active-matrix display apparatus by means of the light-beam heating process, the active-matrix display apparatus at least comprises a substrate, a transistor circuit, a first insulating layer, a lower electrode, a reconfigurable organic light-emitting layer, an upper electrode and a light-to-heat conversion layer. The light-to-heat conversion layer is exposed to a light beam emitted from a light source to form heated regions. Through the heating, color pixels are thus formed on the display apparatus. In addition, whether the reconfigurable organic light-emitting device emits or not is controlled by the transistor circuit.

BRIEF DESCRIPTION OF THE DRAWINGS

FIG. 3 is a cross-sectional view of the reconfigurable organic light-emitting device having a single layer of high-energy-gap carrier-blocking material;

FIG. 4a to FIG. 4d are molecular structures of organic materials used in organic layers of the reconfigurable organic light-emitting device in FIG. 3;

FIG. 15a and FIG. 15b are diagrams illustrating the device structure and heating method of a reconfigurable organic light-emitting device using external heating sources, wherein FIG. 15b illustrates the device after being fabricated;

FIG. 16a and FIG. 16b are diagrams illustrating the heating method for heating the reconfigurable organic light-emitting device by shining a light-beam on a light-to-heat conversion layer thereon, wherein FIG. 16a illustrates the device before being heated and reconfigured, and FIG. 16b illustrates the device after being heated and reconfigured;

DETAILED DESCRIPTION OF THE REFERRED EMBODIMENTS

The preferred embodiments of the present invention for a reconfigurable organic light-emitting device and a display apparatus employing the reconfigurable organic light-emitting device are hereinafter described in detail, together with the accompanied drawings, wherein like reference numbers represent like elements. In the following, the organic light-emitting structure, the method for local heating for reconfiguring such structure and the display apparatus are discussed consecutively.

1. Organic Light-Emitting Structure:

(1) Single High-Energy-Gap Carrier-Blocking Layer

Figure 1:
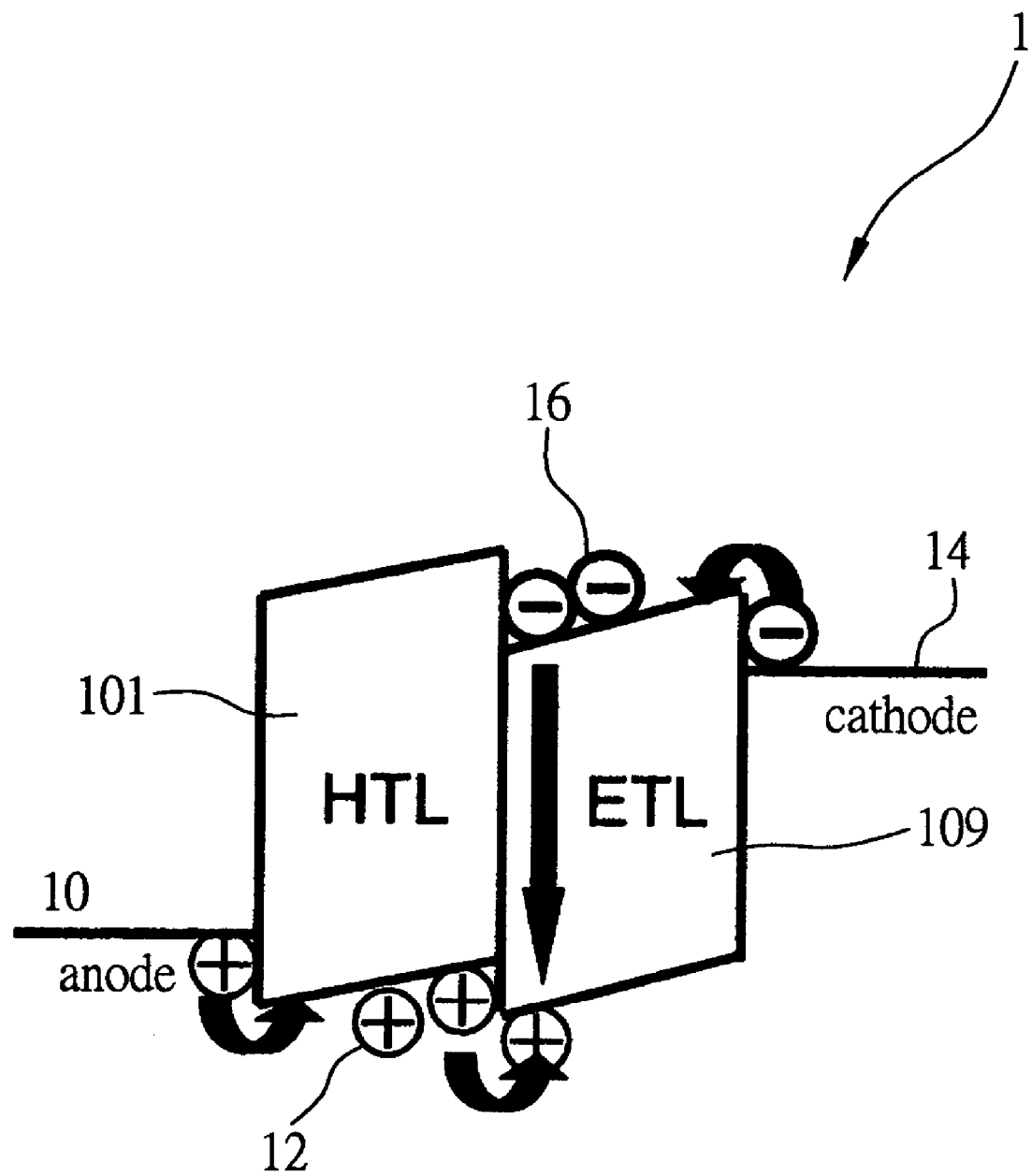
FIG. 1 (PRIOR ART) illustrates the schematic energy level diagram of a conventional organic light-emitting device.
Figure 2A:
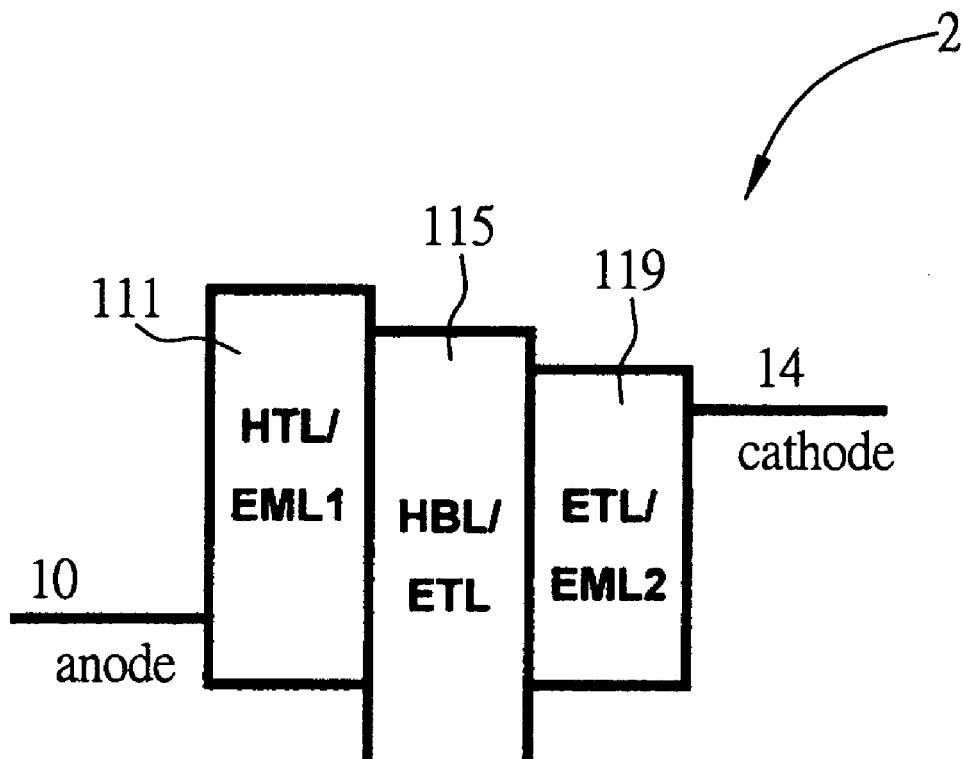
FIG. 2a and FIG. 2b are schematic energy level diagrams, illustrating a reconfigurable organic light-emitting device having a single layer high-energy-gap carrier-blocking layer in the present invention.
Figure 2B:
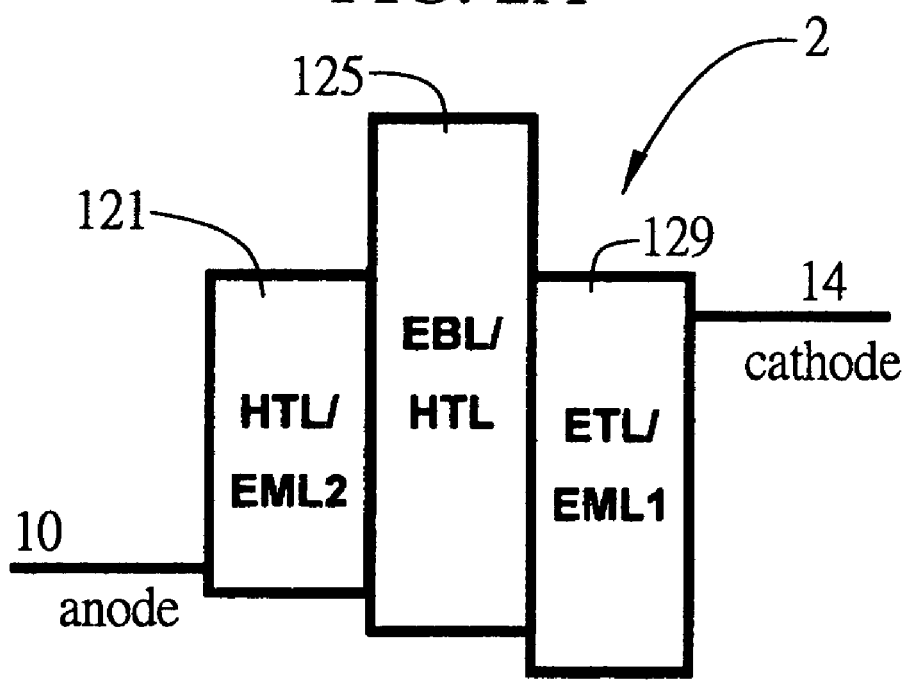

Referring now to FIG. 2a and FIG. 2b, wherein various structures of a reconfigurable organic light-emitting device 2 of the present invention are illustrated, the reconfigurable organic light-emitting device 2 has one layer of high-energy-gap carrier-blocking material. As shown in FIG. 2a, the reconfigurable organic light-emitting organic device 2 comprises an anode 10, a hole-transport/first light-emitting layer (HTL/EML1) 111, a hole-blocking/electron-transport layer (HBL/ETL) 115, an electron-transport/second light-emitting layer (ETL/EML2) 119 and a cathode 14, wherein the material of the hole-blocking/electron-transport layer 115 having a glass transition temperature of Tg is selected, and the glass transition temperature Tg is smaller than those of other organic material layers used. In addition, by appropriately choosing the material of the hole-transport/first light-emitting layer 111 and the electron-transport/second light-emitting layer 119, the wavelength of emission of the hole-transport/first light-emitting layer 111 is smaller than that of the electron-transport/second light-emitting layer 119. If the hole-transport/first light-emitting layer 111 and the electron-transport/second light-emitting layer 119 are inter-diffused and excited to emit light, light with the characteristic spectrum of the electron-transport/second light-emitting layer 119 is emitted.

Under such structure, holes are injected through the anode 10 into the hole-transport/first light-emitting layer 111 of the organic light-emitting device. When holes are transported to the boundary of the hole-transport/first light-emitting layer 111 and the hole-blocking/electron-transport layer 115 through the hole-transport/first light-emitting layer 111, holes would be blocked by the hole-blocking/electron-transport layer 115 and accumulated at the right hand side of the hole-transport/first light-emitting layer 111. On the other hand, the electrons injected into the electron-transport/second light-emitting layer 119 of the organic light-emitting device through the cathode 14 may be transported from the cathode 14, through the electron-transport/second light-emitting layer 119 and the hole-blocking/electron-transport layer 115, to the left hand side of the hole-blocking/electron-transport layer, and recombine with holes accumulated at the right hand side of the hole-transport/first light-emitting layer 111 so as to emit light. Meanwhile, the light having the characteristic spectrum of the hole-transport/first light-emitting layer 111 is thus emitted.

If a heating process is performed on the light-emitting device 2 during the fabricating process of the device or after the device is fabricated, when the heating temperature is higher than the glass transition temperature Tg of the hole-blocking/electron-transport layer 115 and lower than those of the other organic material layers, the molecules of the hole-blocking/electron-transport layer 115 become more permeable, diffusable or inter-diffusable than other material layers. Therefore, the hole-blocking/electron-transport layer 115 starts the inter-diffusion process with the adjacent hole-transport/first light-emitting layer 111 and the electron-transport/second light-emitting layer 119, and the hole-transport/first light-emitting layer 111 and the electron-transport/second light-emitting layer 119 may then be bridged or mixed so as to bypass the hole-blocking characteristics of the hole-blocking/electron-transport layer 115. Since the wavelength of the light emitted by the material of the hole-transport/first light-emitting layer 111 is smaller than that of the electron-transport/second light-emitting layer 119, when the hole-transport/first light-emitting layer 111 and the electron-transport/second light-emitting layer 119 are mixed, the electrons and the holes may be recombined in the material of the hole-transport/first light-emitting layer 111 and emit light of the electron-transport/second light-emitting layer 119 by means of energy transfer to the electron-transport/second light-emitting layer 119, or, the electrons and the holes directly recombine in the electron-transport/second light-emitting layer 119 to emit light of the electron-transport/second light-emitting layer 119. The emission in accordance with two above-mentioned mechanisms are both from the electron-transport/second light-emitting layer 119, and the characteristic spectrum of the emission is thus altered from that of the hole-transport/first light-emitting layer 111 to that of the electron-transport/second light-emitting layer 119.

Referring now to FIG. 2b, the reconfigurable organic light-emitting device 2 comprises an anode 10, a hole-transport/second light-emitting layer (HTL/EML1) 121, an electron-blocking/hole-transport layer (EBL/HTL) 125, an electron-transport/first light-emitting layer (ETL/EML1) 129 and a cathode 14, wherein the material of the electron-blocking/hole-transport layer 125 having a glass transition temperature of Tg is selected, and the glass transition temperature Tg is smaller than those of other material layers. In addition, by selecting the material of the electron-transport/second light-emitting layer 121 and the electron-transport/first light-emitting layer 129, the wavelength of the emission by the hole-transport/second light-emitting layer 121 is larger than that of the electron-transport/first light-emitting layer 129. Therefore, hole-transport/second light-emitting layer 121 and the electron-transport/first light-emitting layer 129 are inter-diffused and excited to emit light, and the light with the characteristic spectrum of the electron-transport/second light-emitting layer 121 is thus emitted.

Under such structure, electrons are injected through the cathode 14 into the electron-transport/first light-emitting layer 129 of the organic light-emitting device 2. When the electrons are transported to the boundary of the electron-transport/first light-emitting layer 129 and the electron-blocking/hole-transport layer 125 through the electron-transport/first light-emitting layer 129, the electrons would be blocked by the electron-blocking/hole-transport layer 125 and accumulated at the left hand side of the electron-transport/first light-emitting layer 129. On the other hand, holes injected into the hole-transport/second light-emitting layer 121 of the organic light-emitting device 2 through the anode 10 may be transported from the anode 10, through the electron-blocking/hole-transport layer 125, to the right hand side of the electron-blocking/hole-transport layer 125, and recombined with the electrons accumulated at the left hand side of the electron-transport/first light-emitting layer 129 so as to emit light. Meanwhile, the light having the characteristic spectrum of the electron-transport/first light-emitting layer 129 is thus emitted.

If a heating process is performed on the light-emitting device 2 during the fabricating process of the device or after the device is fabricated, when the heating temperature is higher than the glass transition temperature Tg of the electron-blocking/hole-transport layer 125 and lower than that of the other organic material layers, the molecules of the electron-blocking/hole-transport layer 125 thus become more permeable, diffusable or interdiffusable than that of the other organic material layers. Therefore, when the electron-blocking/hole-transport layer 125 starts the inter-diffusion process with the adjacent hole-transport/second light-emitting layer 121 and the electron-transport/first light-emitting layer 129, the hole-transport/second light-emitting layer 121 and the electron-transport/first light-emitting layer 129 may then be bridged or mixed so as to bypass the electron-blocking characteristics of the electron-blocking/hole-transport layer 125. Since the wavelength of the emission by the material of the electron-transport/first light-emitting layer 129 is smaller than that of the hole-transport/second light-emitting layer 121, the electrons and the holes may be recombined at the electron-transport/first light-emitting layer 129 and emit light by means of energy conversion after transferring to the hole-transport/second light-emitting layer 121, when the electron-transport/first light-emitting layer 129 and the hole-transport/second light-emitting layer 121 are mixed. Or, the electrons and the holes may emit light after directly recombined in the hole-transport/second light-emitting layer 121. The emission in accordance with the above-mentioned light-emitting method are both from the hole-transport/second light-emitting layer 121, and the characteristic spectrum of the emission is thus altered from that of the electron-transport/first light-emitting layer 129 to that of the hole-transport/second light-emitting layer 121.

Example:

The following further discloses the structure and materials selected for each of the organic layers of the reconfigurable organic light-emitting device 2 of the present invention. As shown in FIG. 3 and FIG. 4, the reconfigurable organic light-emitting device 2 comprises a glass substrate 30 coated with ITO as a lower electrode, a layer of polyethylene dioxythiophene/polystyrene sulphonate (PEDT:PSS; see FIG. 4a) as a hole injection layer 32, a layer of N,N'-diphenyl-N,N'-bis (4'-(N,N-bis(naphth-1-yl)-amino)-biphenyl-4-yl)-benzidine (a triarylamine tetramer, TATE, FIG. 4b) as a hole-transport/first light-emitting layer 131, a layer of 2,9-dimethyl-4,7-diphenyl-1,10-phenanthroline (BCP; see FIG. 4c) as a hole-blocking/electron-transport layer 135, a layer of tris-(8-hydroxyquinoline) aluminum (Alq; see FIG. 4d) as an electron-transport/second light-emitting layer 139, and a layer of lithium fluoride and aluminum (LiF/Al) as an electron-injection layer and an upper electrode 34, respectively. The material of the hole-transport/first light-emitting layer 131 emits blue light, while the electron-transport/second light-emitting layer 139 emits green light. Furthermore, the glass transition temperature of the hole-transport/first light-emitting layer 131 is approximately 150° C., the glass transition temperature of the hole- blocking/electron-transport layer 135 is approximately 80° C., and the glass transition temperature of the electron-transport/second light-emitting layer 139 is approximately 170° C. Referring to FIG. 3, the device structure of the reconfigurable organic light-emitting device 2 of the present invention is illustrated, wherein the glass substrate 30 coated with ITO is the lower electrode, and a layer of PEDT:PSS with a thickness of 300 Å is deposited thereon as the hole injection layer 32; a layer of TATE with a thickness of 400 Å is then deposited on the hole injection layer 32 as the hole-transport/first light-emitting layer 131; a layer of BCP with a thickness of 150 Å is subsequently deposited on the hole-transport/first light-emitting layer 131 as the hole-blocking/electron-transport layer 135; a layer of Alq with a thickness of 600 Å is then deposited on the hole-blocking/electron-transport layer 135 as the electron-transport/second light-emitting layer 139; finally, a layer of lithium fluoride with a thickness of 5 Å is subsequently deposited on the electron-transport/second light-emitting layer 139 and a layer of aluminum with a thickness of 1500 Å as the electron injection layer and the upper electrode 34.

Figure 5A:
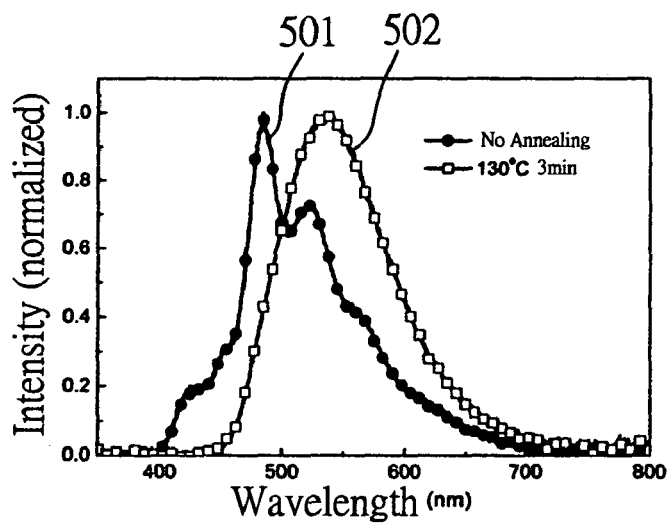
FIG. 5a to FIG. 5c are diagrams illustrating the light-emitting characteristics of the reconfigurable organic light-emitting device in one particular embodiment of the present invention.
Figure 5B:
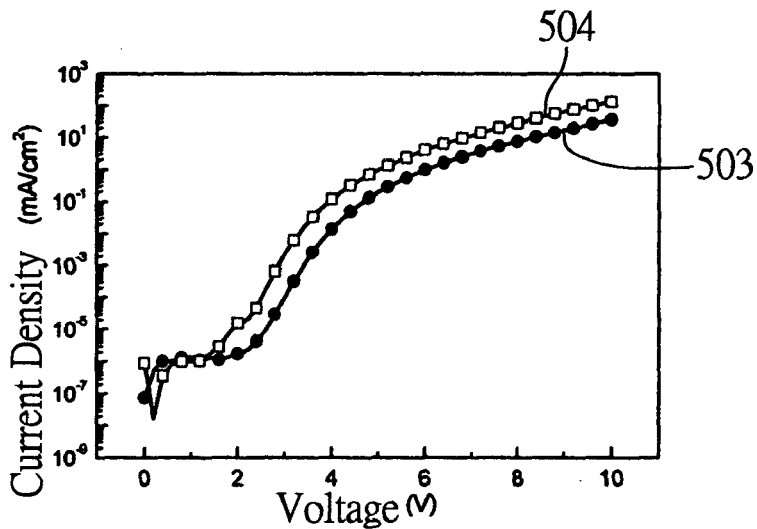
Figure 5C:
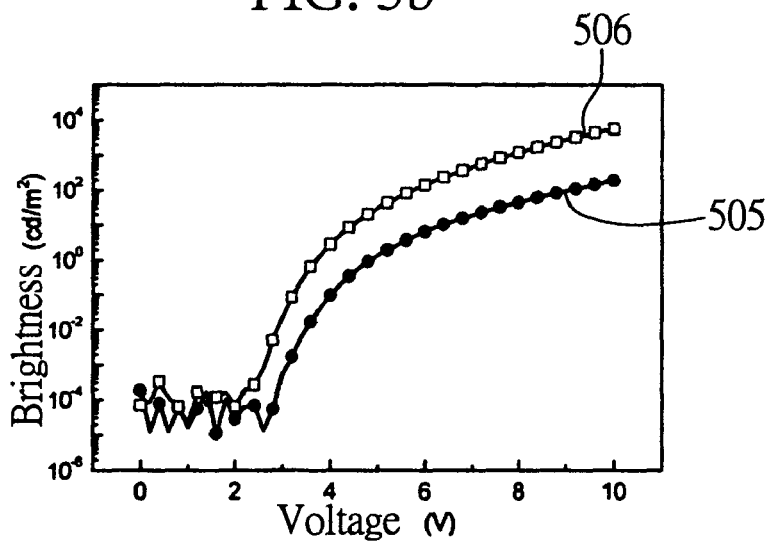

Referring now to FIG. 5a, the normalized intensity—wavelength characteristics measured after applying a current density of approximately 25 mA/cm$^2$ on the reconfigurable organic light-emitting device 2 of the present invention are illustrated. As shown in the figure, the curve 501 as represented by solid circles illustrates the emission spectrum after the reconfigurable organic light-emitting device 2 of the present invention is fabricated, and before any conversion (heating) process. By observing the curve 501, one finds a peak of approximately 480 nm, which represents the characteristic emission spectrum of the hole-transport/first light-emitting layer 131 that emits blue light. After heating the reconfigurable organic light-emitting device 2 at a temperature of 130° C. for 3 minutes, the characteristic spectrum of the reconfigurable organic light-emitting device 2 changes to curve 502 represented by hollow squares. By observing the curve 502, one finds a peak at the wavelength of approximately 530 nm. It represents the characteristic emission spectrum of the electron-transport/second light-emitting layer 139 that emits green light. Therefore, according to FIG. 5a, it is confirmed that the reconfigurable organic light-emitting device 2 of the present invention indeed changes its emission wavelength by means of a heating process. Referring next to FIG. 5b and FIG. 5c, wherein the characteristics of the measured current density—voltage and the light-emitting brightness—voltage after applying a bias voltage of 0 volts to 10 volts on the reconfigurable organic light-emitting device 2 of the present invention are illustrated, respectively. Curves 503 and 505 as represented by solid circles illustrate the characteristics of the reconfigurable organic light-emitting device 2 of the present invention before any heating process, while curves 504 and 506 as represented by hollow squares illustrate the characteristics of the reconfigurable organic light-emitting device 2 of the present invention after a heating process is performed for 3 minutes. As shown in FIG. 5b and FIG. 5c, the characteristics of the reconfigurable organic light-emitting device 2 of the present invention remain in good operation conditions both before or after the heating process. Therefore, either before or after the heating process, the reconfigurable organic light-emitting device 2 of the present invention remains in a good operation state.

(2) Double High-Energy-Gap Carrier-Blocking Layer

Figure 6A:
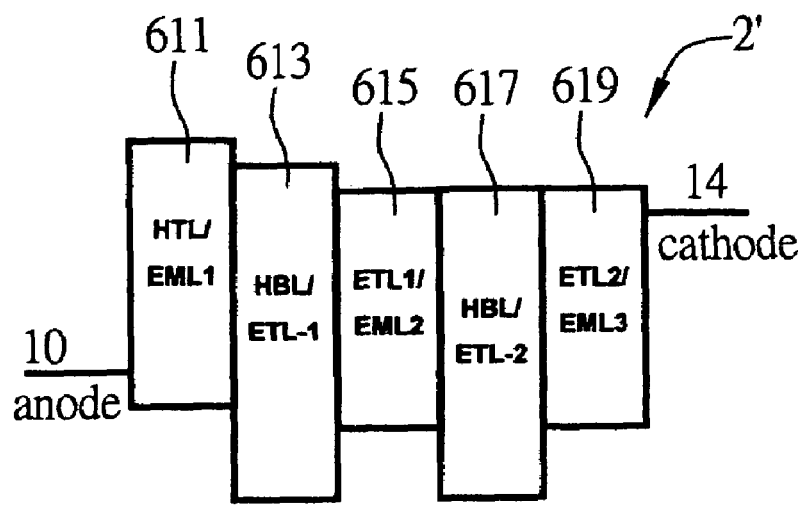
FIG. 6a to FIG. 6d are energy level diagrams, illustrating a reconfigurable light-emitting device having two layers of high-energy-gap carrier-blocking material.

Referring now to FIG. 6a to FIG. 6d, various structures of reconfigurable organic light-emitting devices 2' having two layers of high-energy-gap carrier-blocking materials are illustrated. As shown in FIG. 6a, the reconfigurable organic light-emitting device 2' comprises an anode 10, a hole-transport/first light-emitting layer 611 (HTL/EML1), a first hole-blocking/electron-transport layer 613 (HBL/ETL1), a first electron-transport/second light-emitting layer 615 (ETL1/EML2), a second hole-blocking/electron-transport layer 617 (HBL/ETL2), a second electron-transport/third light-emitting layer 619 (ETL2/EML3) and a cathode 14. The materials of the first hole-blocking/electron-transport layer 613 and the second hole-blocking/electron-transport layer 617 having glass transition temperatures of Tg1 and Tg2 are selected, respectively, where Tg1 is smaller than Tg2, and the glass transition temperatures Tg1 and Tg2 are both smaller than those of other organic materials used. Moreover, the materials of the hole-transport/first light-emitting layer 611, the first electron-transport/second light-emitting layer 615 and the second electron-transport/third light-emitting layer 619 are selected such that the emission wavelength of the hole-transport/first light-emitting layer 611 is smaller than that of the first electron-transport/second light-emitting layer 615, and the emission wavelength of the first electron-transport/second light-emitting layer 615 is smaller than that of the second electron-transport/third light-emitting layer 619. When the hole-transport/first light-emitting layer 611 and the first electron- transport/second light-emitting layer 615 are inter-diffused and excited to emit light, the light is thus emitted by the first electron-transport/second light-emitting layer 615. When the hole-transport/first light-emitting layer 611 and the first electron-transport/second light-emitting layer 615, and the second electron-transport/third light-emitting layer 619 are inter-diffused and excited to emit light, the light is thus emitted by the second electron-transport/third light-emitting layer 619.

Under such structure, holes are injected to the hole-transport/first light-emitting layer 611 of the organic light-emitting device 2' through the anode 10. When the holes are transported to the boundary of the hole-transport/first light-emitting layer 611 and the first hole-blocking/electron-transport layer 613 through the hole-transport/first light-emitting layer 611, holes would be blocked by the first hole-blocking/electron-transport layer 613 and accumulated at the right hand side of the hole-transport/first light-emitting layer 611. On the other hand, the electrons injected into the second electron-transport/third light-emitting layer 619 of the organic light-emitting device 2' through the cathode 14 are transported from the cathode 14, through the second electron-transport/third light-emitting layer 619 and the second hole-blocking/electron-transport layer 617, the first electron-transport/second light-emitting layer 615 and the first hole-blocking/electron-transport layer 613, to the left hand side of the first hole-blocking/electron-transport layer 613, and recombine with holes accumulated at the right hand side of the hole-transport/first light-emitting layer 611 so as to emit light. Consequently, light having the characteristic spectrum of the hole-transport/first light-emitting layer 611 is thus emitted.

If a heating process is performed on the light-emitting device 2' during the fabricating process of the device or after the device is fabricated, when the heating temperature is higher than the glass transition temperature Tg1 of the first hole-blocking/electron-transport layer 613, the molecules of the first hole-blocking/electron-transport layer 613 thus become more active. Therefore, the first hole-blocking/electron-transport layer 613 starts the inter-diffusion process with the adjacent hole-transport/first light-emitting layer 611 and the first electron-transport/second light-emitting layer 615, and the hole-transport/first light-emitting layer 611 and the first electron-transport/second light-emitting layer 615 may then be bridged or mixed so as to bypass the hole-blocking characteristics of the first hole-blocking/electron-transport layer 613. Since the emission wavelength of the material of the hole-transport/first light-emitting layer 611 is smaller than that of the first electron-transport/second light-emitting layer 615 when the hole-transport/first light-emitting layer 611 and the first electron-transport/second light-emitting layer 615 are mixed, the electrons and the holes may be recombined at the hole-transport/first light-emitting layer 611 and emit light of the first electron-transport/second light-emitting layer 615 by energy transfer to the first electron-transport/second light-emitting layer 615; or, the electrons and the holes may directly recombine in the first electron-transport/second light-emitting layer 615 to emit light of the first electron-transport/second light-emitting layer 615. The emission in accordance with two above-mentioned mechanisms are both from the first electron-transport/second light-emitting layer 615, the characteristic spectrum of the emission is thus changed from that of the hole-transport/first light-emitting layer 611 to that of the electron-transport/second light-emitting layer 615.

If a heating process is performed on the light-emitting device 2' during the fabricating process of the device or after the device is fabricated, when the heating temperature is higher than the glass transition temperature Tg2 of the second hole-blocking/electron-transport layer 617 and lower than those of other organic material layers used, the molecules of the second hole-blocking/electron-transport layer 617 thus become more active. Therefore, when the second hole-blocking/electron-transport layer 617 starts the inter-diffusion process with the adjacent first hole-transport/second light-emitting layer 615 and the second electron-transport/third light-emitting layer 619, the first electron-transport/second light-emitting layer 615 and the second electron-transport/third light-emitting layer 619 may then be bridged or mixed so as to bypass the hole-blocking characteristics of the second hole-blocking/electron-transport layer 617. Since the emission wavelength of the material of the first hole-transport/second light-emitting layer 615 is smaller than that of the second electron-transport/third light-emitting layer 619, the electrons and the holes may be recombined at the first electron-transport/second light-emitting layer 615 and emit light by energy transfer to the second electron-transport/third light-emitting layer 619, when the first electron-transport/second light-emitting layer 615 and the second electron-transport/third light-emitting layer 619 are mixed. Or, the electrons and the holes may emit light after directly recombine in the second electron-transport/third light-emitting layer 619. The emission in accordance with two above-mentioned mechanisms are both from the second electron-transport/third light-emitting layer 619, and the characteristic spectrum of the emission is thus changed from that of the first electron-transport/second light-emitting layer 615 to that of the second electron-transport/third light-emitting layer 619.

Figure 6B:
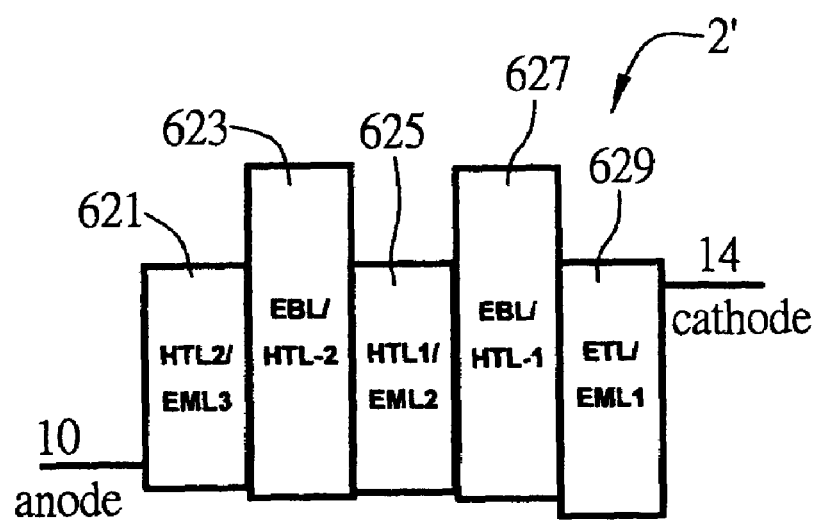

Referring now to FIG. 6b, it illustrates that the reconfigurable organic light-emitting device 2' comprises an anode 10, a second hole-transport/third light-emitting layer 621 (HTL2/EML3), a second electron-blocking/hole-transport layer 623 (HBL/HTL2), a first hole-transport/second light-emitting layer 625 (HTL1/EML2), a first electron-blocking/hole-transport layer 627 (HBL/HTL1), an electron-transport/first light-emitting layer 629 (ETL/EML1) and a cathode 14, wherein the materials of the second electron-blocking/hole-transport layer 623 and the first electron-blocking/hole-transport layer 627 having glass transition temperatures of Tg1 and Tg2 are selected, respectively, wherein Tg1 is smaller than Tg2, and the glass transition temperatures Tg1 and Tg2 are both smaller than those of other organic material layers used. Moreover, the materials of the second hole-transport/third light-emitting layer 621, the first hole-transport/second light-emitting layer 625 and the electron-transport/first light-emitting layer 629 are selected such that the emission wavelength of the electron-transport/first light-emitting layer 629 is smaller than that of the first hole-transport/second light-emitting layer 625, and the emission wavelength of the first hole-transport/second light-emitting layer 625 is smaller than that of the second hole-transport/third light-emitting layer 621. When the electron-transport/first light-emitting layer 629 and the first hole-transport/second light-emitting layer 625 are inter-diffused and excited to emit light, the light is thus emitted by the first hole-transport/second light-emitting layer 625. When the electron-transport/first light-emitting layer 629 and the first hole-transport/second light-emitting layer 625, and the second bole-transport/third light-emitting layer 621 are inter-diffused and excited to emit light, the light is thus emitted by the second hole-transport/third light-emitting layer 621.

Under such structure, electrons are injected to the electron-transport/first light-emitting layer 629 of the organic light-emitting device 2' through the cathode 14. When the electrons are transported to the boundary of the electron-transport/first light-emitting layer 629 and the first electron-blocking/hole-transport layer 627 through the electron-transport/first light-emitting layer 629, the electrons would be blocked by the first electron-blocking/hole-transport layer 627 and accumulated at the left hand side of the electron-transport/first light-emitting layer 629. On the other hand, the holes injected into the second hole-transport/third light-emitting layer 621 of the organic light-emitting device 2' through the anode 10 may be transported from the anode 10, through the second hole-transport/third light-emitting layer 621 and the second electron-blocking/hole-transport layer 623, and through the first hole-transport/second light-emitting layer 625 and the first electron-blocking/hole-transport layer 627, to the right hand side of the first electron-blocking/hole-transport layer 627, and recombined with the electrons accumulated at the left hand side of the electron-transport/first light-emitting layer 629 so as to emit light. Accordingly, the light having the characteristic spectrum of the electron-transport/first light-emitting layer 629 is thus emitted.

If a heating process is performed on the light-emitting device 2' during the fabricating process of the device or after the device is fabricated, when the heating temperature is higher than the glass transition temperature Tg1 of the first electron-blocking/hole-transport layer 627 and lower than those of other organic material layers used, the molecules of the first electron-blocking/hole-transport layer 627 thus become more active. Therefore, when the first electron-blocking/hole-transport layer 627 starts the inter-diffusion process with the adjacent first hole-transport/second light-emitting layer 625 and the electron-transport/first light-emitting layer 629, the first hole-transport/second light-emitting layer 625 and the electron-transport/first light-emitting layer 629 may then be bridged or mixed so as to bypass the electron blocking characteristics of the first electron-blocking/hole-transport layer 627. Since the emission wavelength of the material of the electron-transport/first light-emitting layer 629 is smaller than that of the first hole-transport/second light-emitting layer 625, the electrons and the holes may be recombined at the electron-transport/first light-emitting layer 629 and emit light by energy transfer to the first hole-transport/second light-emitting layer 625, when the electron-transport/first light-emitting layer 629 and the first hole-transport/second light-emitting layer 625 are mixed. Or, the electrons and the holes may directly recombine in the first hole-transport/second light-emitting layer 625 to emit light. The emission in accordance with two mechanisms are both from the first hole-transport/second light-emitting layer 625, and the characteristic spectrum of the emission is thus changed from that of the electron-transport/first light-emitting layer 629 to that of the first hole-transport/second light-emitting layer 625.

If a heating process is performed on the light-emitting device 2' during the fabricating process of the device or after the device is fabricated, when the heating temperature is higher than the glass transition temperature Tg2 of the second electron-blocking/hole-transport layer 623 and lower than those of other organic material layers used, the molecules of the second electron-blocking/hole-transport layer 623 thus become more active. Therefore, when the second electron-blocking/hole-transport layer 623 starts the inter-diffusion process with the adjacent first hole-transport/second light-emitting layer 625 and the second hole-transport/third light-emitting layer 621, the first hole-transport/second light-emitting layer 625 and the second hole-transport/third light-emitting layer 621 may then be bridged or mixed so as to bypass the electron blocking characteristics of the second electron-blocking/hole-transport layer 623. Since the emission wavelength of the material of the first hole-transport/second light-emitting layer 625 is smaller than that of the second hole-transport/third light-emitting layer 621, the electrons and the holes may be recombined at the first hole-transport/second light-emitting layer 625 and emit light by energy transfer to the second hole-transport/third light-emitting layer 621, when the first hole-transport/second light-emitting layer 625 and the second hole-transport/third light-emitting layer 621 are mixed. Or, the electrons and the holes may directly recombine in the second hole-transport/third light-emitting layer 621 to emit light. The emission in accordance with two above-mentioned mechanisms are both from the second hole-transport/third light-emitting layer 621, and the characteristic spectrum of the emission is thus changed from that of the first hole-transport/second light-emitting layer 625 to that of the second hole-transport/third light-emitting layer 621.

Figure 6C:
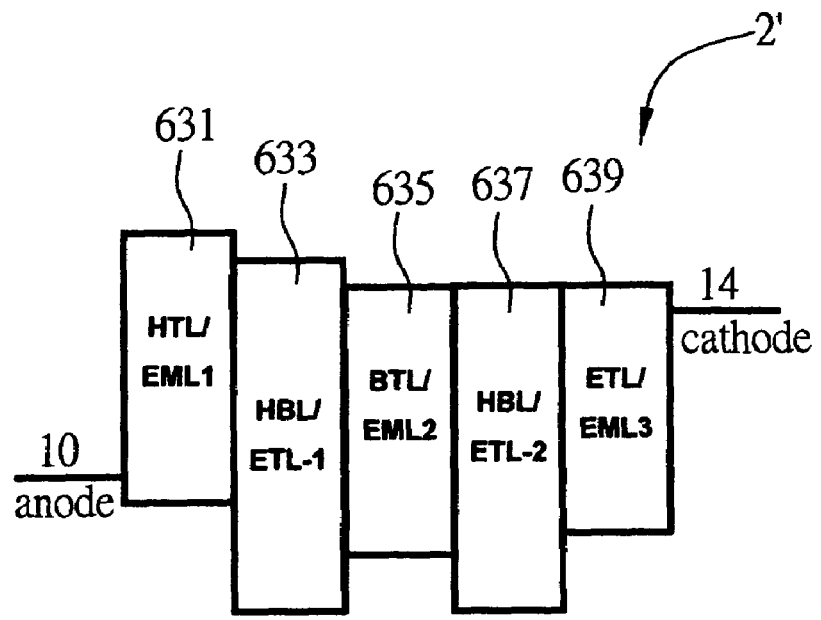

Referring now to FIG. 6c, it illustrates that the reconfigurable organic light-emitting device 2' comprises an anode 10, a hole-transport/first light-emitting layer 631 (HTL/EML1), a first hole-blocking/electron-transport layer 633 (HBL/ETL1), an electron hole-transport/second light-emitting layer 635 (BTL1/EML2), a second hole-blocking/electron-transport layer 637 (HBL/ETL2), an electron-transport/third light-emitting layer 639 (ETL/EML3) and a cathode 14, wherein the materials of the first hole-blocking/electron-transport layer 633 and the second hole-blocking/electron-transport layer 637 having glass transition temperatures of Tg1 and Tg2 are selected, respectively, wherein Tg1 is smaller than Tg2, and the glass transition temperatures Tg1 and Tg2 are both smaller than those of other organic material layers used. Moreover, the materials of the hole-transport/first light-emitting layer 631, electron hole-transport/second light-emitting layer 635 and the electron-transport/third light-emitting layer 639 are selected such that the emission wavelength of the hole-transport/first light-emitting layer 631 is smaller than that of the electron hole-transport/second light-emitting layer 635, and the emission wavelength of the electron hole-transport/second light-emitting layer 635 is smaller than that of the electron-transport/third light-emitting layer 639. When the hole-transport/first light-emitting layer 631 and the electron hole-transport/second light-emitting layer 635 are inter-diffused and excited to emit light, the light is thus emitted by the electron hole-transport/second light-emitting layer 635. When the hole-transport/first light-emitting layer 631 and the electron hole-transport/second light-emitting layer 635, and the electron-transport/third light-emitting layer 639 are inter-diffused and excited to emit light, the light is thus emitted by the electron-transport/third light-emitting layer 639.

Under such structure, holes are injected to the hole-transport/first light-emitting layer 631 of the organic light-emitting device 2' through the anode 10. When holes are transported to the boundary of the hole-transport/first light-emitting layer 631 and the first hole-blocking/electron-transport layer 633 through the hole-transport/first light-emitting layer 631, the holes would be blocked by the first hole-blocking/electron-transport layer 633 and accumulated at the right hand side of the hole-transport/first light-emitting layer 631. On the other hand, the electrons are injected into the electron-transport/third light-emitting layer 639 of the organic light-emitting device 2' through the cathode 14 may be transported from the cathode 14, through the electron-transport/third light-emitting layer 639 and the second hole-blocking/electron-transport layer 637, and through the electron hole-transport/second light-emitting layer 635 and the first hole-blocking/electron-transport layer 633, to the left hand side of the first hole-blocking/electron-transport layer 633, and recombined with holes accumulated at the right hand side of the hole-transport/first light-emitting layer 631 so as to emit light. Meanwhile, light having the characteristic spectrum of the hole-transport/first light-emitting layer 631 is thus emitted.

If a heating process is performed on the light-emitting device 2' during the fabricating process of the device or after the device is fabricated, when the heating temperature is higher than the glass transition temperature Tg1 of the first hole-blocking/electron-transport layer 633 and lower than those of other organic material layers used, the molecules of the first hole-blocking/electron-transport layer 633 thus become more active. Therefore, when the first hole-blocking/electron-transport layer 633 starts the inter-diffusion process with the adjacent electron hole-transport/second light-emitting layer 635 and the hole-transport/first light-emitting layer 631, the electron hole-transport/second light-emitting layer 635 and the hole-transport/first light-emitting layer 631 may then be bridged or mixed so as to bypass the hole-blocking characteristics of the first hole-blocking/electron-transport layer 633. Since the emission wavelength of the material of the hole-transport/first light-emitting layer 631 is smaller than that of the electron hole-transport/second light-emitting layer 635, the electrons and the holes may be recombined at the hole-transport/first light-emitting layer 631 and emit light by means of energy conversion after transferring to the electron hole-transport/second light-emitting layer 635, when the hole-transport/first light-emitting layer 631 and the electron hole-transport/second light-emitting layer 635 are mixed. Or, the electrons and the holes may directly recombine in the electron hole-transport/second light-emitting layer 635 to emit light. The emission in accordance with two mechanisms are both from the electron hole-transport/second light-emitting layer 635, and the characteristic spectrum of the light emitted is thus changed from that of the hole-transport/first light-emitting layer 631 to that of the electron hole-transport/second light-emitting layer 635.

If a heating process is performed on the light-emitting device 2' during the fabricating process of the device or after the device is fabricated, when the heating temperature is higher than the glass transition temperature Tg2 of the second hole-blocking/electron-transport layer 637 and lower than those of the other organic material layers, the molecules of the second hole-blocking/electron-transport layer 623 thus become more active. Therefore, when the second hole-blocking/electron-transport layer 637 starts the inter-diffusion process with the adjacent electron hole-transport/second light-emitting layer 635 and the electron-transport/third light-emitting layer 639, the electron hole-transport/second light-emitting layer 635 and the electron-transport/third light-emitting layer 639 may then be bridged or mixed so as to diminish the hole-blocking characteristics of the second hole-blocking/electron-transport layer 637. Since the wavelength of the light emitted by the material of the electron hole-transport/second light-emitting layer 635 is smaller than that of the electron-transport/third light-emitting layer 639, the electrons and the holes may be recombined at the electron hole-transport/second light-emitting layer 635 and emit light by means of energy conversion after transferring to the electron-transport/third light-emitting layer 639, when the electron hole-transport/second light-emitting layer 635 and the electron-transport/third light-emitting layer 639 are mixed. Or, the electrons and the holes may emit light after directly recombined in the electron-transport/third light-emitting layer 639. The light emitted in accordance with the above-mentioned light-emitting method are both emitted by the electron-transport/third light-emitting layer 639, and the characteristic spectrum of the light emitted is thus altered from that of the electron hole-transport/second light-emitting layer 635 to that of the electron-transport/third light-emitting layer 639.

Figure 6D:
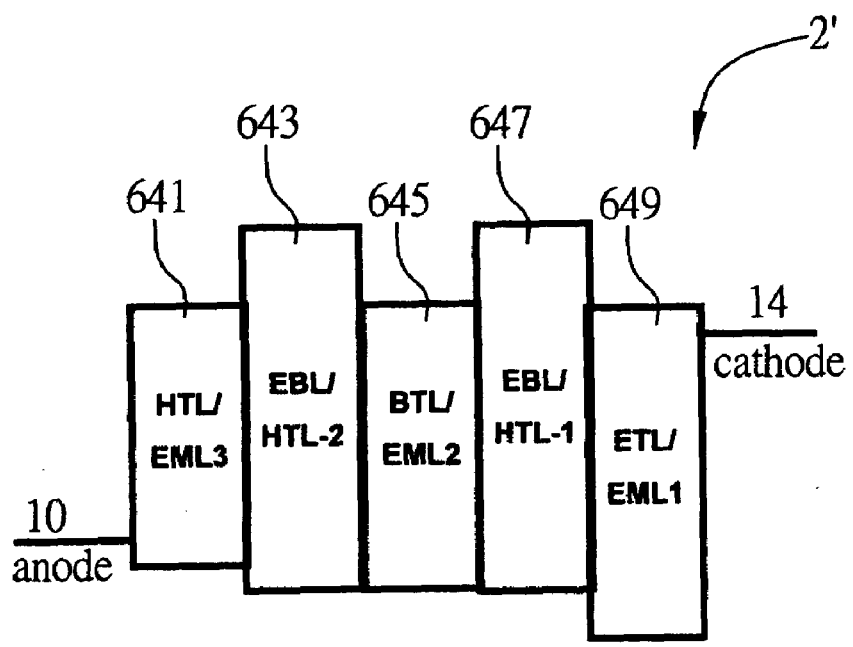

Referring now to FIG. 6d, it illustrates that the reconfigurable organic light-emitting device 2' comprises an anode 10, a hole-transport/third light-emitting layer 641 (HTL/EML3), a second electron blocking/hole-transport layer 643 (EBL/HTL2), an electron hole-transport/second light-emitting layer 645 (BTL/EML2), a first electron blocking/hole-transport layer 647 (EBL/HTL1), an electron-transport/first light-emitting layer 649 (ETL/EML1) and a cathode 14, wherein the materials of the second electron blocking/hole-transport layer 643 and the first electron blocking/hole-transport layer 647 having glass transition temperature of Tg1 and Tg2 are selected, respectively, wherein Tg1 is smaller than Tg2, and the glass transition temperatures Tg1 and Tg2 are both smaller than those of the other selected organic material layers. Moreover, the materials of the hole-transport/third light-emitting layer 641, the electron hole-transport/second light-emitting layer 645 and the electron-transport/first light-emitting layer 649 are selected such that the wavelength of the light emitted by the electron-transport/first light-emitting layer 649 is smaller than that of the electron hole-transport/second light-emitting layer 645, and the wavelength of the light emitted by the electron hole-transport/second light-emitting layer 645 is smaller than that of the hole-transport/third light-emitting layer 641. When the electron-transport/first light-emitting layer 649 and the electron hole-transport/second light-emitting layer 645 are inter-diffused and excited to emit light, the light is thus emitted by the electron-transport/first light-emitting layer 649. When the electron-transport/first light-emitting layer 649 and the electron hole-transport/second light-emitting layer 645, and the hole-transport/third light-emitting layer 641 are inter-diffused and excited to emit light, the light is thus emitted by the hole-transport/third light-emitting layer 641.

Under such structure, electrons are injected to the electron-transport/first light-emitting layer 649 of the organic light-emitting device 2' through the cathode 14. When the electrons are transported to the boundary of the electron-transport/first light-emitting layer 649 and the first electron blocking/hole-transport layer 647 through the electron-transport/first light-emitting layer 649, the electrons would be blocked by the first electron blocking/hole-transport layer 647 and accumulated at the left hand side of the electron-transport/first light-emitting layer 649. On the other hand, the holes injected into the hole-transport/third light-emitting layer 641 of the organic light-emitting device 2' through the anode 10 may be transported from the anode 10, through the hole-transport/third light-emitting layer 641 and the second electron blocking/hole-transport layer 643, and through the electron hole-transport/second light-emitting layer 645 and the first electron blocking/hole-transport layer 647, to the right hand side of the first electron blocking/hole-transport layer 647, and recombined with the electrons accumulated at the left hand side of the electron-transport/first light-emitting layer 649 so as to emit light. Meanwhile, the light having the characteristic spectrum of the electron-transport/first light-emitting layer 649 is thus emitted.

If a heating process is performed on the light-emitting device 2' during the fabricating process of the device or after the device is fabricated, when the heating temperature is higher than the glass transition temperature Tg1 of the first electron blocking/hole-transport layer 647 and lower than those of the other organic material layers, the molecules of the first electron blocking/hole-transport layer 647 thus become more active. Therefore, when the first electron blocking/hole-transport layer 647 starts the inter-diffusion process with the adjacent electron hole-transport/second light-emitting layer 645 and the electron-transport/first light-emitting layer 649, the electron hole-transport/second light-emitting layer 645 and the electron-transport/first light-emitting layer 649 may then be bridged or mixed so as to diminish the electron blocking characteristics of the first electron blocking/hole-transport layer 647. Since the wavelength of the light emitted by the material of the electron-transport/first light-emitting layer 649 is smaller than that of the electron hole-transport/second light-emitting layer 645, the electrons and the holes may be recombined at the electron-transport/first light-emitting layer 649 and emit light by means of energy conversion after transferring to the electron hole-transport/second light-emitting layer 645, when the electron-transport/first light-emitting layer 649 and the electron hole-transport/second light-emitting layer 645 are mixed. Or, the electrons and the holes may emit light after directly recombined in the electron hole-transport/second light-emitting layer 645. The light emitted in accordance with the above-mentioned light-emitting method are both emitted by the electron hole-transport/second light-emitting layer 645, and the characteristic spectrum of the light emitted is thus altered from that of the electron-transport/first light-emitting layer 649 to that of the electron hole-transport/second light-emitting layer 645.

If a heating process is performed on the light-emitting device 2' during the fabricating process of the device or after the device is fabricated, when the heating temperature is higher than the glass transition temperature Tg2 of the second electron blocking/hole-transport layer 643 and lower than those of the other organic material layers, the molecules of the second electron blocking/hole-transport layer 643 thus become more active. Therefore, when the second electron blocking/hole-transport layer 643 starts the inter-diffusion process with the adjacent electron hole-transport/second light-emitting layer 645 and the hole-transport/third light-emitting layer 641, the electron hole-transport/second light-emitting layer 645 and the hole-transport/third light-emitting layer 641 may then be bridged or mixed so as to diminish the electron blocking characteristics of the second electron blocking/hole-transport layer 643. Since the wavelength of the light emitted by the material of the electron hole-transport/second light-emitting layer 645 is smaller than that of the hole-transport/third light-emitting layer 641, the electrons and the holes may be recombined at the electron hole-transport/second light-emitting layer 645 and emit light by means of energy conversion after transferring to the hole-transport/third light-emitting layer 641, when the electron hole-transport/second light-emitting layer 645 and the hole-transport/third light-emitting layer 641 are mixed. Or, the electrons and the holes may emit light after directly recombined in the hole-transport/third light-emitting layer 641. The light emitted in accordance with the above-mentioned light-emitting method are both emitted by the hole-transport/third light-emitting layer 641, and the characteristic spectrum of the light emitted is thus altered from that of the electron hole-transport/second light-emitting layer 645 to that of the hole-transport/third light-emitting layer 641.

Figure 7:
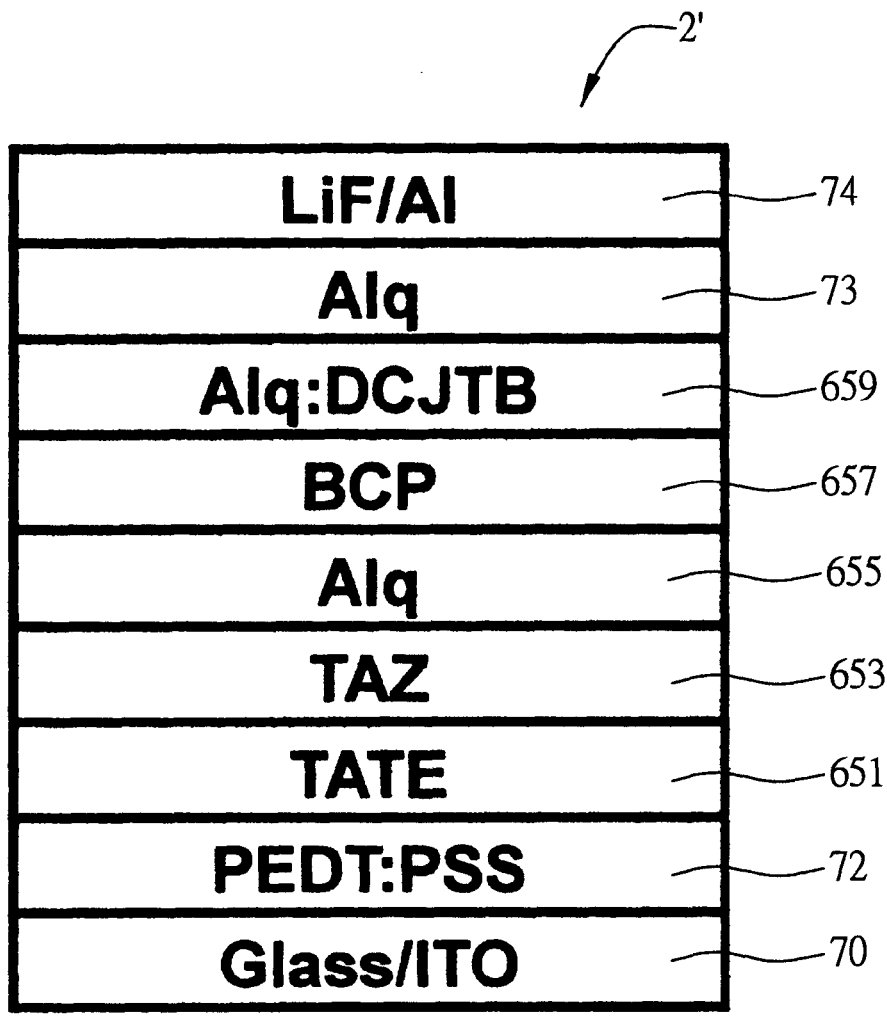
FIG. 7 is a cross-sectional view of the reconfigurable organic light-emitting device having two layers of high-energy-gap carrier-blocking materials.
Figure 8A:
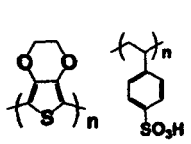
FIG. 8a to FIG. 8f are the molecular structures of organic materials used in the reconfigurable organic light-emitting device in FIG. 7.
Figure 8B:
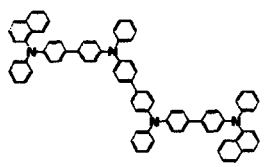
Figure 8C:
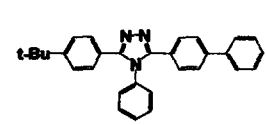
Figure 8D:
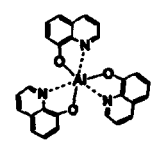
Figure 8E:
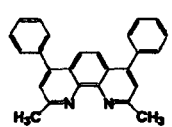
Figure 8F:
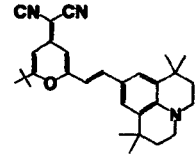

Example:

The following further discloses the material selected for each of the organic layers of the reconfigurable organic light-emitting device 2' of the present invention. As shown in FIG. 7 and FIG. 8, the reconfigurable organic light-emitting device 2' comprises a glass substrate 70 electroplated with ITO as a lower electrode, a layer of polyethylene dioxythiophene/polystyrene sulphonate (PEDT:PSS; see FIG. 8a) as a hole injection layer 72, a layer of N,N'-diphenyl-N,N'-bis(4'-(N,N-bis(naphth-1-yl)-amino)-biphenyl-4-yl)-benzidine (a triarylamine tetramer) (TATE; see FIG. 8b) as a hole-transport/first light-emitting layer 651, a layer of 3-(4'-tert-butylphenyl)-4-phenyl-5-(4''-biphenyl)-1,2,4-triazole (TAZ; see FIG. 8c) as a first hole-blocking/electron-transport layer 653, a layer of tris-(8-hydroxyquinoline)aluminum (Alq; see FIG. 8d) as a first electron-transport/second light-emitting layer 655, a layer of 2,9-dimethyl-4,7-diphenyl-1,10-phenanthroline (BCP; see FIG. 8e) as a second hole-blocking/electron-transport layer 657, a layer of DCJTB (see FIG. 8f) doped with Alq (Alq:DCJTB) as a second electron-transport/third light-emitting layer 659, a layer of tris-(8-hydroxyquinoline)aluminum (Alq; see FIG. 8d) as an electron-transport layer 73, and a layer of lithium fluoride and aluminum (LiF/Al) as an electron injection layer and an upper electrode 74, respectively. The material of the hole-transport/first light-emitting layer 651 may emit blue light, the first electron-transport/second light-emitting layer 655 may emit green light, and the second electron-transport/third light-emitting layer 659 may emit red light. Furthermore, the glass transition temperature of the hole-transport/first light-emitting layer 651 is approximately 150° C., the glass transition temperature of the first hole-blocking/electron-transport layer 653 is approximately 70° C., the glass transition temperature of the first electron-transport/second light-emitting layer 655 is approximately 170° C., and the glass transition temperature of the second hole-blocking/electron-transport layer 657 is approximately 80° C. Referring to FIG. 7, the device structure of the reconfigurable organic light-emitting device 2' of the present invention is illustrated, wherein the glass substrate 70 electroplated with ITO is the lower electrode, and a layer of PEDT:PSS with a thickness of 300 Å is deposited thereon as the hole injection layer 72; a layer of TATE with a thickness of 400 Å is then deposited on the hole injection layer 72 as the hole-transport/first light-emitting layer 651; a layer of TAZ with a thickness of 75 Å is subsequently deposited on the hole-transport/first light-emitting layer 651 as the first hole-blocking/electron-transport layer 653; a layer of Alq with a thickness of 75 Å is then deposited on the hole-blocking/electron-transport layer 653 as a first electron-transport/second light-emitting layer 655; a layer of BCP with a thickness of 100 A is subsequently deposited on the first electron-transport/second light-emitting layer 655 as the second hole-blocking/electron-transport layer 657; a layer of Alq:DCJTB (2 wt. %) with a thickness of 150 Å is then deposited on the second hole-blocking/electron-transport layer 657 as the second electron-transport/third light-emitting layer 659; a layer of Alq with a thickness of 350 Å is subsequently deposited on the second electron-transport/third light-emitting layer 659 as the electron-transport layer 73; finally, a layer of lithium fluoride with a thickness of 5 Å and a layer of aluminum with a thickness of 1500 Å are sequentially deposited on the second electron-transport/third light-emitting layer 659 as the electron injection layer and the upper electrode 74, respectively.

Figure 9A:
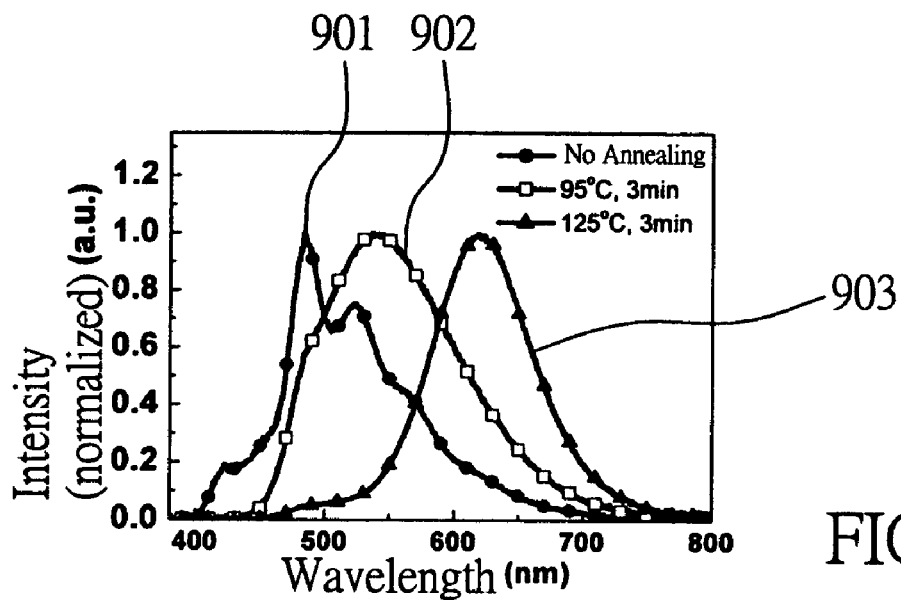
FIG. 9a to FIG. 9c are diagrams illustrating the light-emitting characteristics of the reconfigurable organic light-emitting device in one particular embodiment of the present invention.
Figure 9B:
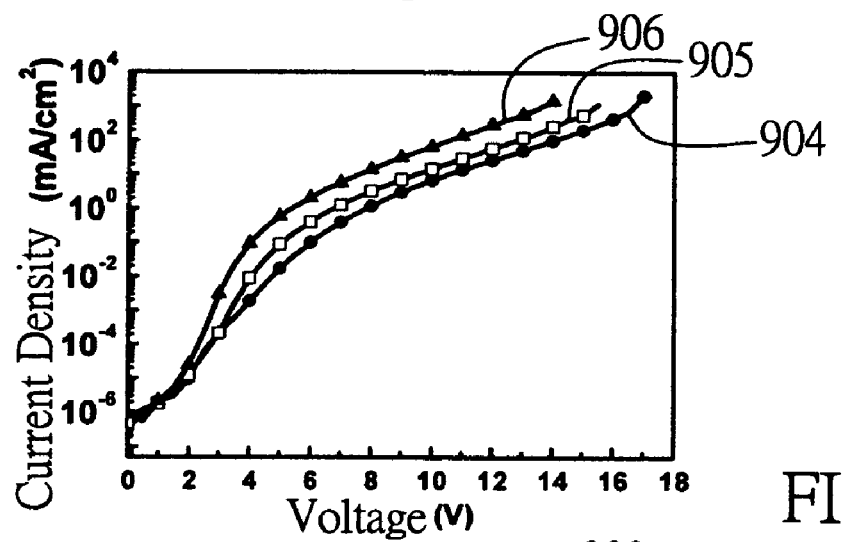
Figure 9C:
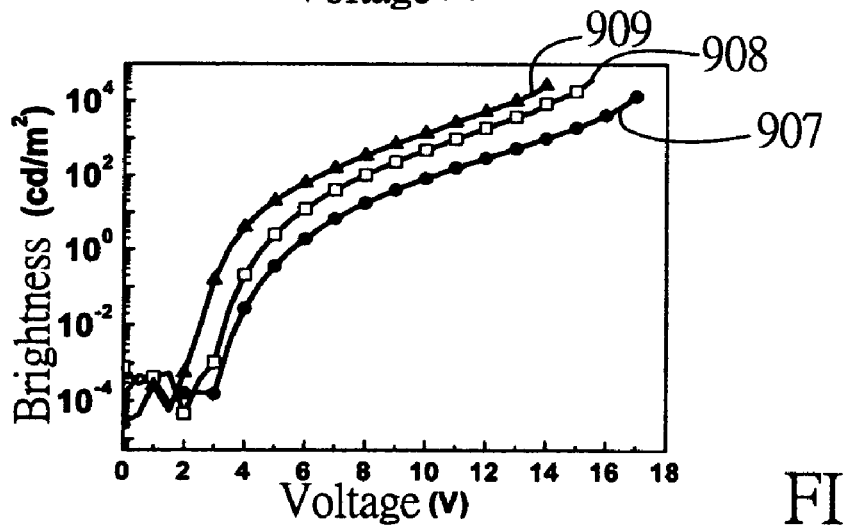

Referring now to FIG. 9a, wherein the normalized intensity—wavelength characteristics diagram measured after applying a power of current density with approximately 25 mA/cm$^2$ on the reconfigurable organic light-emitting device 2' of the present invention is illustrated. As shown in the figure, the curve 901 as represented by solid circles illustrates the characteristic spectrum curve measured after the reconfigurable organic light-emitting device 2' of the present invention is fabricated, and before any conversion (heating) process. By observing the curve 901, one may easily find a peak of light-emitting intensity at the wavelength of approximately 480 nm. It is thus understood that the curve 901 represents the characteristic spectrum curve of the hole-transport/first light-emitting layer 651 that emits blue light. After heating the reconfigurable organic light-emitting device 2' by a temperature of 95° C. for 3 minutes, the characteristic spectrum of the reconfigurable organic light-emitting device 2' alters to curve 902 represented by hollow squares. By observing the curve 902, one may find a light-emitting intensity peak at the wavelength of approximately 530 nm. It is thus understood that the curve 902 represents the characteristic spectrum curve of the first electron-transport/second light-emitting layer 655 that emits green light. Furthermore, after heating the reconfigurable organic light-emitting device 2' by a temperature of 125° C.

for 3 minutes, the characteristic spectrum of the reconfigurable organic light-emitting device 2' alters to curve 903 represented by solid triangles. By observing the curve 903, one may find a light-emitting intensity peak at the wavelength of approximately 610 nm. It is thus understood that the curve 903 represents the characteristic spectrum curve of the second electron-transport/third light-emitting layer 659 that emits red light. Therefore, according to FIG. 9*a*, it is assured that the reconfigurable organic light-emitting device 2' of the present invention may indeed change the emission wavelength of its emitted light by means of a heating process. Referring next to FIG. 9*b* and FIG. 9*c*, wherein the characteristics of the measured current density—voltage and the light-emitting illuminance—voltage after applying a bias voltage of 0 volts to 17 volts on the reconfigurable organic light-emitting device 2' of the present invention are illustrated, respectively. Wherein, curve 904 and curve 907 as represented by solid circles illustrate the characteristics of the reconfigurable organic light-emitting device 2' of the present invention before any heating process, curve 905 and curve 908 as represented by hollow squares illustrate the characteristics of the reconfigurable organic light-emitting device 2' of the present invention after a heating process with a temperature of 95° C. is performed for 3 minutes, and curve 906 and curve 909 as represented by solid triangle illustrate the characteristics of the reconfigurable organic light-emitting device 2' of the present invention after a heating process with a temperature of 125° C. is performed for 3 minutes. As shown in FIG. 9*b* and FIG. 9*c*, the behavior of the characteristics of the reconfigurable organic light-emitting device 2' of the present invention remains in good quality regardless of before or after the heating process. Therefore, either before or after the heating process, the reconfigurable organic light-emitting device 2' of the present invention remains in a good operation state.

It should be understood, herein, that in two of the examples described above as having single high-energy-gap carrier-blocking layer or double high-energy-gap carrier-blocking layers, the materials used are selected as having certain carrier transport capability. In order to extend the tunable range for the light emitted from the organic light-emitting device, the materials in the organic light-emitting device may be doped with light-emitting dopant so as to emit light from the light-emitting dopant. Doping of the light-emitting dopent into the organic light-emitting material is well known to one skilled with the art. The description of the doping method is thus neglected.

In addition, two of the examples described above illustrate the reconfigurable organic light-emitting device of the present invention having a single high-energy-gap carrier-blocking layer and having double high-energy-gap carrier-blocking layers. It should be understood, however, that the reconfigurable organic light-emitting device may also have three or more high-energy-gap carrier-blocking layers so as to achieve the multi-color functionality via a single organic light-emitting device.

2. Selective Heating Method for Structural Reconfiguration:

In accordance with the above, the heating method using heating sources and the heating method using a light beam, for performing a localized heating process on the reconfigurable organic light-emitting device disclosed above, are further discussed in the following. The heating method using thermal heating further divides into heating methods with built-in resistive heating and with external heating source.

Figure 10:
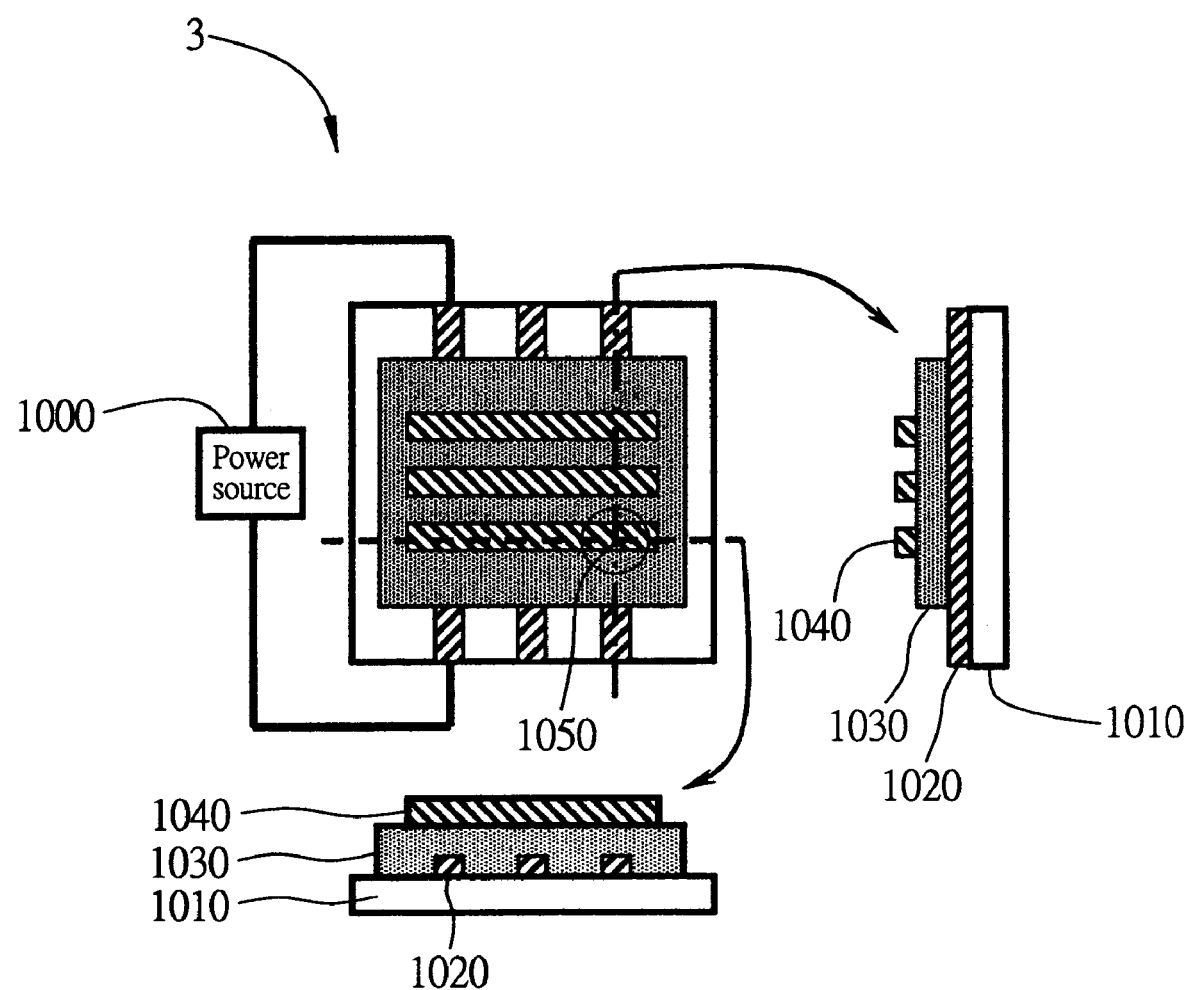
FIG. 10 shows a front view and a side view of a reconfigurable organic light-emitting device having built-in resistive heating electrodes in accordance with the present invention.

(1) Heating Method with a Thermal Heating Source:

(a) Built-in Resistive Heating:

Referring now to FIG. 10, wherein an organic light-emitting device 3 having built-in resistive heating electrodes to perform the structural reconfiguration is illustrated. The so-called built-in resistive heating method is to fabricate a material layer with certain resistance on the same substrate of the light-emitting device, so as to perform the localized heating process for the device by applying certain current on the resistance. In one embodiment (FIG. 10), the resistive heating electrode may also be one of the electrodes of the organic light-emitting device 3. The structure as shown comprises a substrate 1010, a patterned lower electrode 1020 of the organic light-emitting device 3, a reconfigurable organic light-emitting structure 1030, a patterned upper electrode 1040 of the organic light-emitting device, and a heating current source 1000. As illustrated in FIG. 10, one may apply sufficient current to both ends of the patterned lower electrode 1020. The structure of the corresponding regions of the organic material may be reconfigured when the temperature of the patterned regions is sufficiently high. The structural reconfiguration process may be performed after the lower electrode 1020 and the reconfigurable organic light-emitting structure 1030 are fabricated and before the upper electrode 1040 is fabricated, or after the upper electrode 1040 is fabricated. If a different amount of current is applied to different regions of the electrode lines, the heating temperature would be different so as to reconfigure different regions of the device into different structures, producing emission of different colors (spectra). Therefore, by controlling the amount of heating current and the amount of time on the lower electrode 1020 of the device, one may achieve localized heating at different temperatures for different devices at different locations, and precisely control the light emission from different device regions.

Similarly, one may also apply a sufficient current to both ends of the patterned upper electrode lines; when the temperature of the patterned regions is sufficiently high, the structure of the regions of the organic material layer may be reconfigured. If a different amount of current is applied to different regions of the electrode lines, the heating temperature would be different so as to encounter different degrees of heating, allowing different regions of the device to reconfigure into different structures, producing emission of different colors (spectra). Therefore, by controlling the amount of current and the amount of time on the upper electrode of the device, one may achieve localized heating at different temperatures for different devices at different locations, and precisely control the light emission from different device regions.

Figure 11:
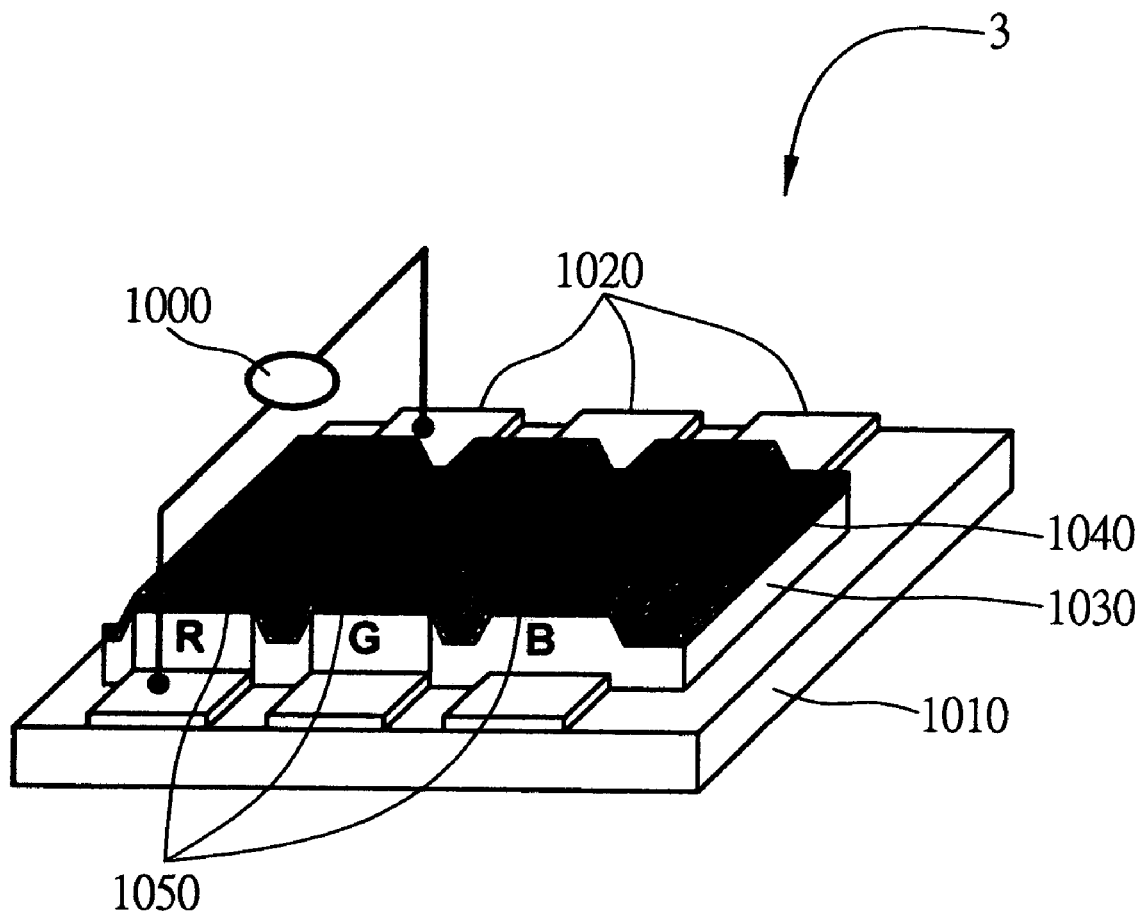
FIG. 11 is a diagram illustrating the device structure and the heating method of the reconfigurable organic light-emitting device having built-in resistive heating electrodes.

Example:

The reconfigurable organic light-emitting device 3 having built-in resistive heating electrodes may further be illustrated in an embodiment as shown in FIG. 11. The reconfigurable organic light-emitting device 3 comprises a heating power source 1000, a glass substrate 1010, a patterned lower electrode 1020 of a transparent ITO, a reconfigurable organic light-emitting layer 1030 and a patterned upper electrode 1040. The patterned lower electrode 1020 of transparent ITO is deposited on the glass substrate 1010, the reconfigurable light-emitting layer 1030 is deposited on the glass substrate 1010 and patterned lower electrode 1020, and the patterned upper electrode 1040 is deposited on the reconfigurable organic light-emitting layer 1030. In this embodiment, the patterned lower electrode 1020 and the patterned upper electrode 1040 are formed in stripes, and the patterned lower electrode 1020 is arranged on the glass substrate 1010 perpendicular to the patterned upper electrode 1040. The overlap between the stripe of the vertically arranged patterned lower electrode 1020 and the stripe of the horizontally arranged patterned upper electrode 1040, in a top view, defines a working unit 1050 of the reconfigurable organic light-emitting device 3 having built-in resistive heating electrodes. In this embodiment, the area of the working unit 1050 is 1 mm² and the stripes of the vertically arranged lower electrode are separated by 1 mm from each other, while the stripes of the horizontally arranged upper electrode are also separated by 1 mm from each other. Moreover, the heating power source 1000 is connected to both ends of the patterned lower electrode 1020 to apply a current on lower electrode 1020 for heating. In this example, the reconfigurable organic light-emitting layer 1030 comprises all the layers between the upper electrode and the lower electrode of the reconfigurable organic light-emitting device 3 having two layers of high-energy gap carrier-blocking layers, in accordance with the embodiment as described in the preceding example. In this example, the resistance of the patterned lower electrode 1020 having a transparent ITO layer is 30Ω/sq. In addition, the patterned upper electrode 1040 is selected from conductive materials such as aluminum, etc.

Meanwhile, by applying a bias voltage on the reconfigurable organic light-emitting device 3 having built-in resistive heating electrodes via the transparent patterned lower electrode 1020 and the patterned upper electrode 1040, the reconfigurable organic light-emitting device 3 having built-in resistive heating electrodes thus emits blue light. If a current density of 480 mA/cm is applied on both ends of the patterned transparent lower electrode 1020 for 3 minutes, the internal structure of the reconfigurable organic light-emitting layer 1030 is changed. If a bias voltage is applied on the changed device, the reconfigurable organic light-emitting device 3 emits green light. Moreover, if a current density of 560 mA/cm is applied on both ends of the transparent patterned lower electrode 1020 for 3 minutes, the internal structure of the reconfigurable organic light-emitting layer 1030 is changed. If a bias voltage is applied on the device, the reconfigurable organic light-emitting device 3 emits red light.

Figure 12A:
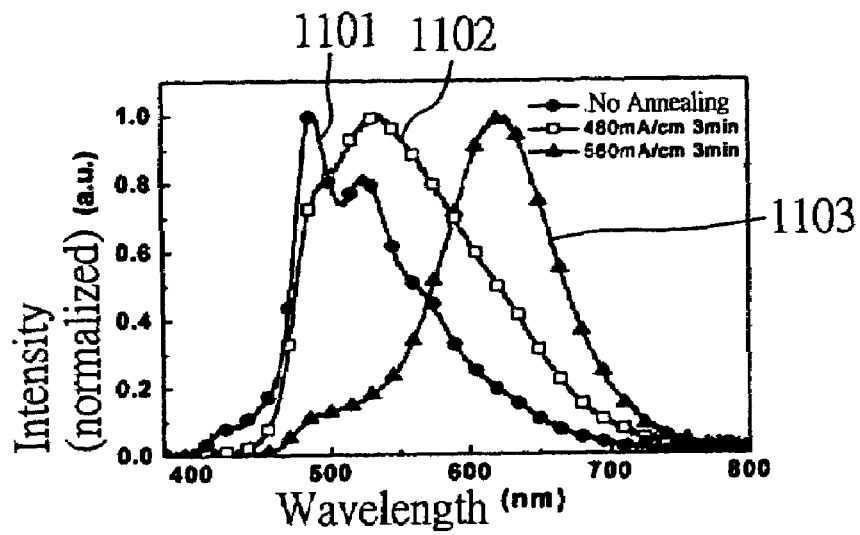
FIG. 12a to FIG. 12c are diagrams illustrating the light-emitting characteristics of the reconfigurable organic light-emitting device in one particular embodiment of the present invention.

Referring now to FIG. 12a, wherein the normalized intensity—wavelength characteristics measured after applying a bias voltage of approximately 10 volts on the reconfigurable organic light-emitting device 3 of the present invention are illustrated. As shown in the figure, the curve 1101 as represented by solid circles illustrates the characteristic spectrum curve measured after the reconfigurable organic light-emitting device 3 having built-in resistive heating electrodes of the present invention is fabricated, and before any conversion (heating) process. By observing the curve 1101, one finds a peak at the wavelength of approximately 480 nm, thus the reconfigurable organic light-emitting device 3 having built-in resistive heating electrodes emits blue light. Then, heating the transparent patterned lower electrode 1020 by applying on both ends thereof a current density of 480 mA/cm for 3 minutes, the characteristic spectrum of the reconfigurable organic light-emitting device 3 alters to curve 1102 represented by hollow squares. By observing the curve 1102, one finds a peak at the wavelength of approximately 530 nm. The curve 1102 represents the characteristic spectrum of green light. By continuing the heating process by applying a current density of 560 mA/cm on both ends of the transparent lower electrode 1020 for 3 minutes, the characteristic spectrum of the reconfigurable organic light-emitting device 3 alters to curve 1103 represented by solid triangles. By observing the curve 1103, one finds a peak at the wavelength of approximately 610 nm. It is thus understood that the curve 1103 represents the characteristic spectrum of red light. Therefore, according to FIG. 12a, it is assured that the reconfigurable organic light-emitting device 3 having built-in resistive heating electrodes, in this example, may indeed change the emission wavelength of its emitted light by means of a heating process.

Figure 12B:
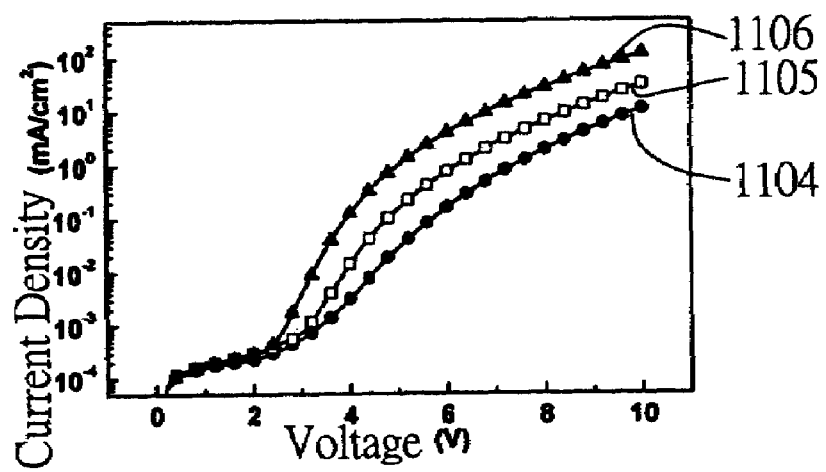
Figure 12C:
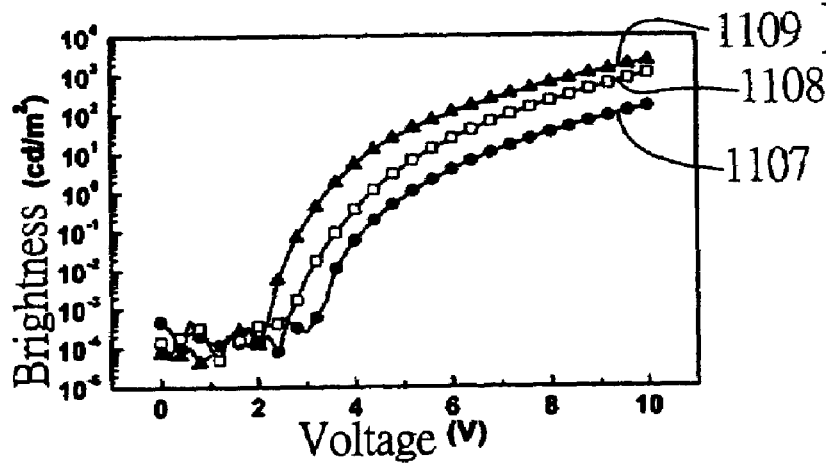

Referring next to FIG. 12b and FIG. 12c, wherein the characteristics of the measured current density—voltage and the light-emitting brightness—voltage after applying a bias voltage of 0 volts to 10 volts on the reconfigurable organic light-emitting device 3 of the present invention are illustrated, respectively. Curve 1104 and curve 1107 as represented by solid circles illustrate the characteristics of the reconfigurable organic light-emitting device 3 having built-in resistive heating electrodes, in this example, before any heating process, curve 1105 and curve 1108 as represented by hollow squares illustrate the characteristics of the reconfigurable organic light-emitting device 3 having built-in resistive heating electrodes, in this example, after applying a current density of 480 mA/cm thereon for 3 minutes, while curve 1106 and curve 1109 as represented by solid triangle illustrate the characteristics of the reconfigurable organic light-emitting device 3 having built-in resistive heating electrodes, in this example, after applying a current density of 560 mA/cm thereon for 3 minutes. As shown in FIG. 12b and FIG. 12c, the behavior of the characteristics of the reconfigurable organic light-emitting device 3 having built-in resistive heating electrodes, in this example, remains in good conditions regardless of before or after the heating process. Therefore, either before or after the heating process, the reconfigurable organic light-emitting device 3 having built-in resistive heating electrodes, in this example, remains in a good operation state.

Example:

The reconfigurable organic light-emitting device 3 having built-in resistive heating electrodes, of the present invention, may also be designed into other embodiments such as further reducing the device dimension and the device separation. The resistance of the patterned lower electrode 1020 having a transparent ITO layer is 15Ω/sq., the width of the working unit 1050 is 80 μm, and the stripe of the vertically arranged lower electrode are separated by 12 μm from each other; all other features are the same as the previous example. Meanwhile, a bias voltage may be applied to the reconfigurable organic light-emitting device 3 having built-in resistive heating electrodes through the patterned lower electrode 1020 having a transparent ITO layer and the patterned upper electrode 1040, the reconfigurable organic light-emitting device 3 having built-in resistive heating electrodes thus emits blue light. The patterned upper electrode 1040 is selected from conductive materials such as lithium fluoride or aluminum, etc. By applying a current density of 2375 mA/cm on both ends of the patterned lower electrode 1020 having a transparent ITO layer for 5 seconds, the internal structure of the reconfigurable organic light-emitting layer 1030 is changed. At this time, if a bias voltage is applied on the device, the reconfigurable organic light-emitting device 3 having built-in resistive heating electrodes thus would emit green light. Moreover, if a current density of 3250 mA/cm is applied on both ends of the transparent patterned lower electrode 1020 for 5 seconds, the internal structure of the reconfigurable organic light-emitting layer 1030 is changed. At this time, if a bias voltage is applied on the device, the reconfigurable organic light-emitting device 3 having built-in resistive heating electrodes would thus emit red light.

Figure 13A:
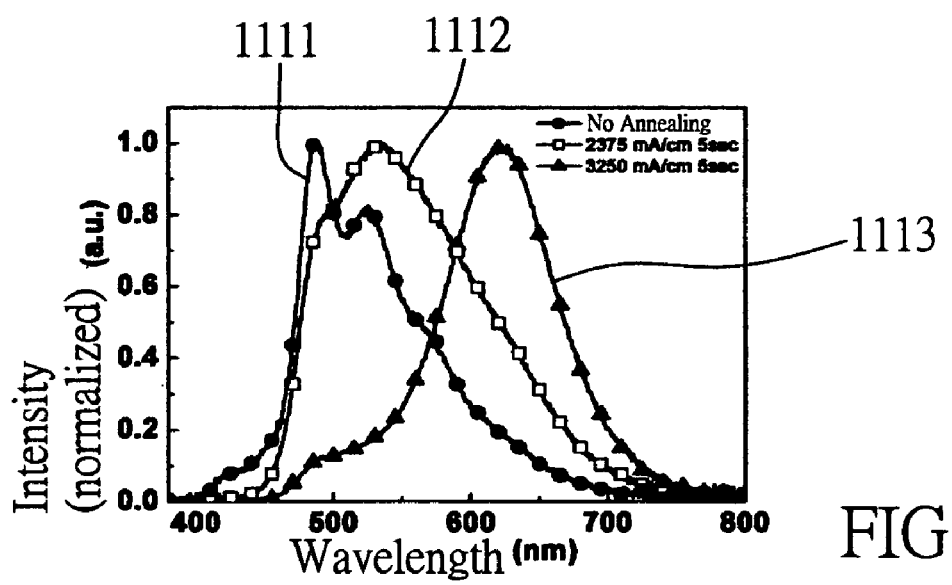
FIG. 13a and FIG. 13c are diagrams illustrating the light-emitting characteristics of the reconfigurable organic light-emitting device in another particular embodiment of the present invention.

Referring now to FIG. 13a, wherein the normalized intensity—wavelength characteristics diagram measured after applying a bias voltage of approximately 10 volts on the reconfigurable organic light-emitting device 3 of the present invention is illustrated. As shown in the figure, the curve 1111 as represented by solid circles illustrates the characteristic spectrum curve measured after the reconfigurable organic light-emitting device 3 having built-in resistive heating electrodes of the present invention is fabricated, and before any conversion (heating) process. By observing the curve 1111, one may easily find a peak of light-emitting intensity at the wavelength of approximately 480 nm, thus the reconfigurable organic light-emitting device 3 having built-in resistive heating electrodes emits blue light. Then, heating the transparent patterned lower electrode 1020 by applying on both ends thereof a current density of 2375 mA/cm for 5 seconds, the characteristic spectrum of the reconfigurable organic light-emitting device 3 alters to curve 1112 represented by hollow squares. By observing the curve 1112, one may find a light-emitting intensity peaks at the wavelength of approximately 530 nm. It is thus understood that the curve 1112 represents the characteristic spectrum that emits green light. By continuing the heating process by applying a current density of 3250 mA/cm on both ends of the transparent lower electrode 1020 for 5 seconds, the characteristic spectrum of the reconfigurable organic light-emitting device 3 alters to curve 1113 represented by solid triangles. By observing the curve 1113, one may find a light-emitting intensity peaks at the wavelength of approximately 610 nm. It is thus understood that the curve 1113 represents the characteristic spectrum curve that emits red light. Therefore, according to FIG. 13a, it is assured that the reconfigurable organic light-emitting device 3 having built-in resistive heating electrodes, in this example, may indeed change the emission wavelength of its emitted light by means of a heating process.

Figure 13B:
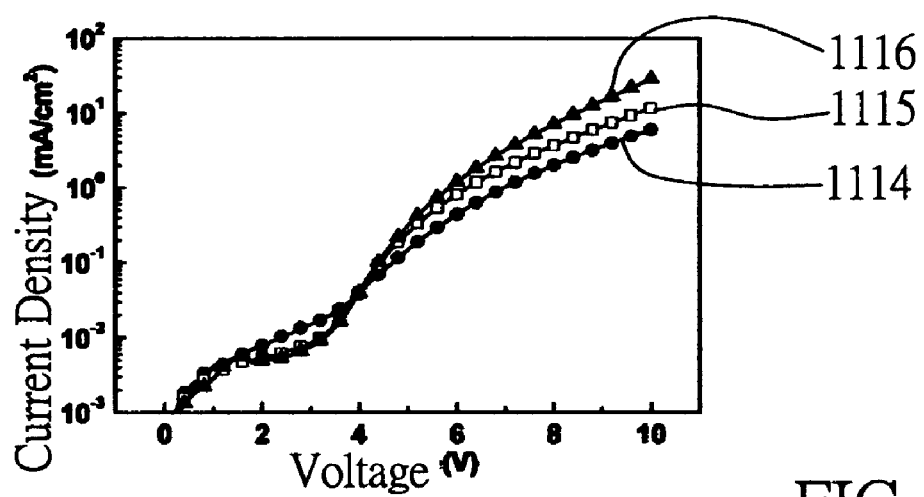
Figure 13C:
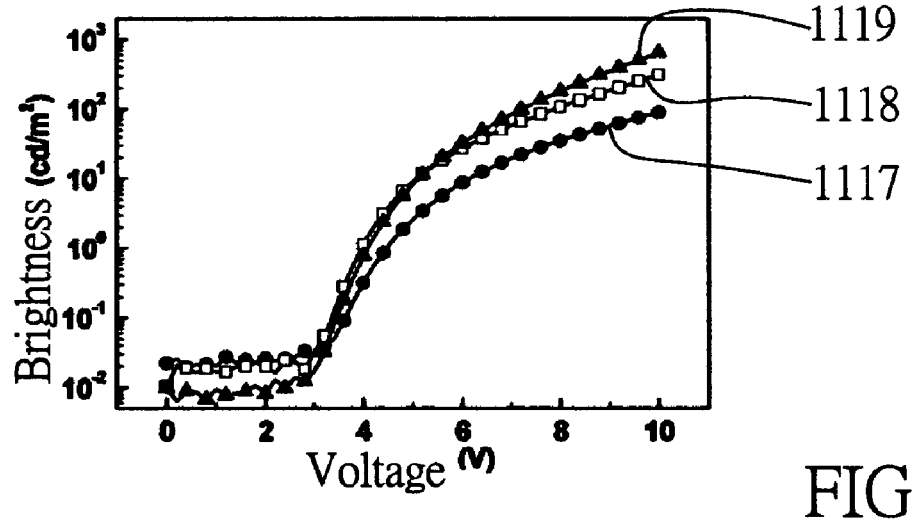

Referring next to FIG. 13b and FIG. 13c, wherein the characteristics of the measured current density—voltage and the light-emitting illuminance—voltage after applying a bias voltage of 0 volts to 10 volts on the reconfigurable organic light-emitting device 3, in this example, are illustrated, respectively. Wherein, curve 1114 and curve 1117 as represented by solid circles illustrate the characteristics of the reconfigurable organic light-emitting device 3 having built-in resistive heating electrodes, in this example, before any heating process, curve 1115 and curve 1118 as represented by hollow squares illustrate the characteristics of the reconfigurable organic light-emitting device 3 having built-in resistive heating electrodes, in this example, after applying a current density of 2375 mA/cm thereon for 5 seconds, while curve 1116 and curve 1119 as represented by solid triangle illustrate the characteristics of the reconfigurable organic light-emitting device 3 having built-in resistive heating electrodes, in this example, after applying a current density of 3250 mA/cm thereon for 5 seconds. As shown in FIG. 13b and FIG. 13c, the behavior of the characteristics of the reconfigurable organic light-emitting device 3 having built-in resistive heating electrodes, in this example, remains in good quality regardless of before or after the heating process. Therefore, either before or after the heating process, the reconfigurable organic light-emitting device 3 having built-in resistive heating electrodes, in this example, remains in a good operation state.

Figure 14:
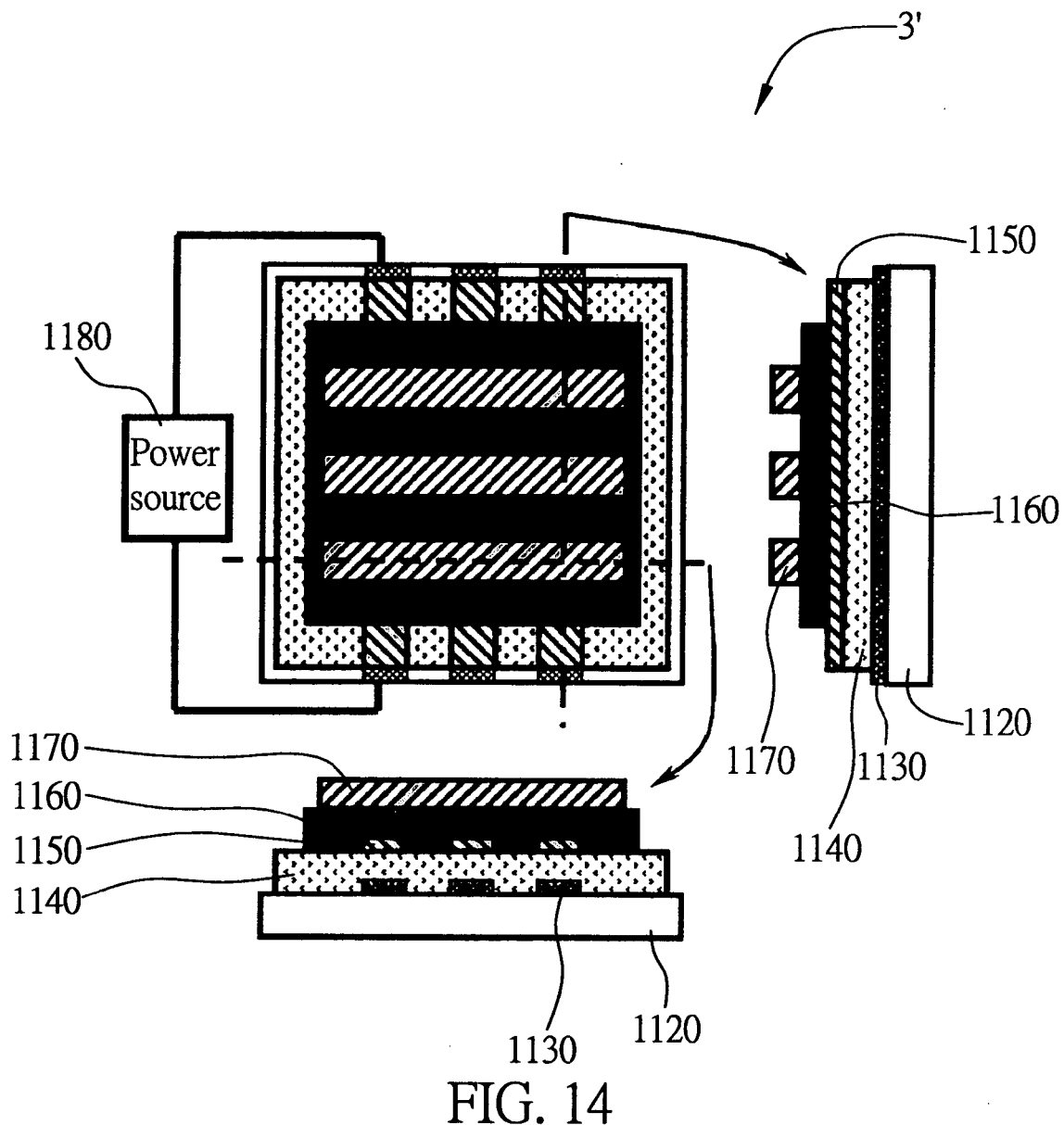
FIG. 14 is a diagram illustrating the device structure and the heating method of the reconfigurable organic light-emitting device having built-in resistive heating electrodes, wherein the heating electrodes are additionally fabricated heating electrodes.

It should be appreciated that, in addition to the structure disclosed above and the description of the two examples, when the upper and lower electrodes of the light-emitting device are both of low resistance materials that are not easy to perform the heating process, one may fabricate another resist layer, still on the same substrate, for performing the heating process. As shown in FIG. 14, the device comprises a substrate 1120, a patterned resistive heating electrode 1130, an insulating buffer layer 1140, a lower electrode 1150 of the organic light emitting device, a reconfigurable organic light-emitting structure 1160, an upper electrode 1170 of the organic light emitting device, and a heating current source 1180. When a sufficient amount of current is applied on both ends of the patterned resistive material 1130, the temperature of the patterned region thus increases so as to reconfigure the structure of the region of the organic material layer. If various different amounts of current are applied on different regions of the resistive material, the heating temperature would also be different, thus different device regions may encounter different degrees of heating, allowing different regions of the device to reconfigure into different structures, whereby the electric light-emitting spectra may be controlled. Therefore, by precisely controlling the amount of heating current and the amount of time applied thereon, one may perform the localized heating process for different devices at different temperatures, so as to precisely control the electric light emission for each device region.

(b) External Heating Source:

The patterned resistive heating electrode, for applying a current thereon and for performing the heating process of the reconfigurable organic light-emitting device 3, may also be deposited on a different substrate to form a reconfigurable organic light-emitting device with external heating source. Referring now to FIG. 15a and FIG. 15b, a reconfigurable organic light-emitting device 3' with an external resistive heating source for performing the heating process is illustrated. The so-called external thermal sourcing method is to fabricate the heating electrode and the light-emitting device on different substrates (or support) wherein the heating electrode may be a layer of resistive material. By tightly contacting the patterned resistive heating electrode with the device, and by applying certain amount of current to the patterned resistive material, the structure of the device in selected areas may thus be changed. Some certain current may also be applied first to the patterned resistive material to increase the temperature, and to tune the device structure later by controlling the contact time between the resistive material and the device. It is appreciated that, in addition to a resistive material, the heating source may also be in other forms.

FIG. 15a illustrates the method for carrying out the localized heating process on the organic thin film, wherein the device comprises a substrate 1190, a lower electrode 1191 of the organic light-emitting device, a reconfigurable organic light-emitting structure 1192, a patterned layer of resistive material 1193, a substrate for the heating source 1194, and a heating power source 1195. FIG. 15b illustrates the fabricated device, in which an upper electrode 1196 is added to the organic light-emitting device compared to FIG. 15a. The fabrication procedure is like the following: fabricating the lower electrode 1191 of the device and the reconfigurable organic light-emitting structure 1192; tightly contacting one side of the resistive material layer with the top surface of the reconfigurable organic light-emitting structure 1192; generating heat by applying a current to the resistive material layer so as to locally heat the organic thin film and to reconfigure its structure; removing the resistive material substrate after reconfiguring the structure of the organic thin film; finally, depositing an upper electrode 1196 to form a completed device. One may also reconfigure the device via heating after the upper electrode 1196 is fabricated. Since the structure of the organic thin film in different regions may be different due to different heating temperatures, the emission spectra may thus be different. One may, therefore, perform localized heating process for different devices at different temperatures by precisely controlling the amount of current applied and the amount of heating time, so as to precisely alter the emission spectra for each device.

(2) Heating with a Light Beam:

In the following, the heating process performed on the reconfigurable organic light-emitting device by means of a light beam is discussed.

To perform heating on the reconfigurable organic light-emitting device by shining a light beam, one should first include one layer of light-to-heat conversion layer with good absorption efficiency in the reconfigurable organic light-emitting device. In order to efficiently employ the light source to heat the reconfigurable device structure, the light beam must be efficiently absorbed by the light-to-heat conversion layer and be converted into heat. It is thus very important to properly select the material of the light-to-heat conversion layer and the corresponding heating light source.

Since the light-to-heat conversion layer must be able to absorb infrared, visible, or ultraviolet light, the light-to-heat conversion layer thus could be selected from, for example, black absorbing materials, organic or inorganic dyes (including dyes for visible light, ultraviolet light, infrared light, etc), pigments, metals, metal oxides, or other suitable materials. In one case, the light-to-heat conversion layer of the present invention is fabricated by vacuum or vapor depositing such as metallic materials for example cobalt, chromium, nickel, zinc, titanium, tin, molybdenum, tungsten, etc, or organic semiconducting materials for example CuPC. In addition to the vacuum or vapor deposition fabrication process, the light-to-heat conversion layer may also be fabricated by employing a spin coating or solution casting method. The light-to-heat conversion layer may be placed in different locations of the device. For example, it could be outside the upper and lower electrodes of the device, or within the upper and lower electrodes of the device, i.e. within the structure of the organic light-emitting device, or the upper and lower electrodes themselves, depending on the device structure (upward emission or downward emission, normal or inverted device structures) or properties of the light-to-heat conversion layer (transparent or not, conductive or not).

Figure 16A:
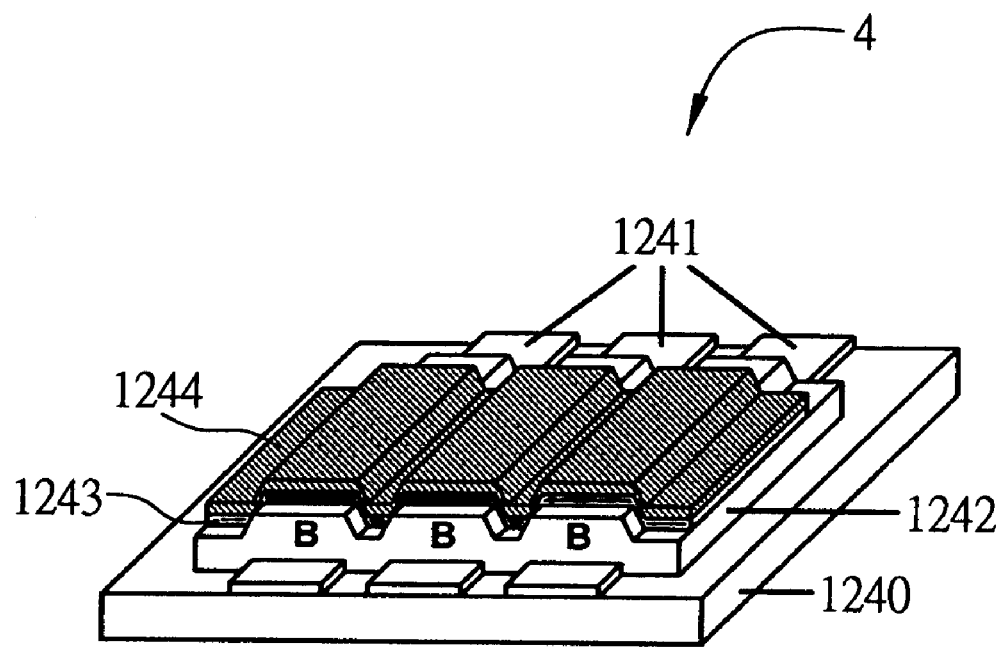
Figure 16B:
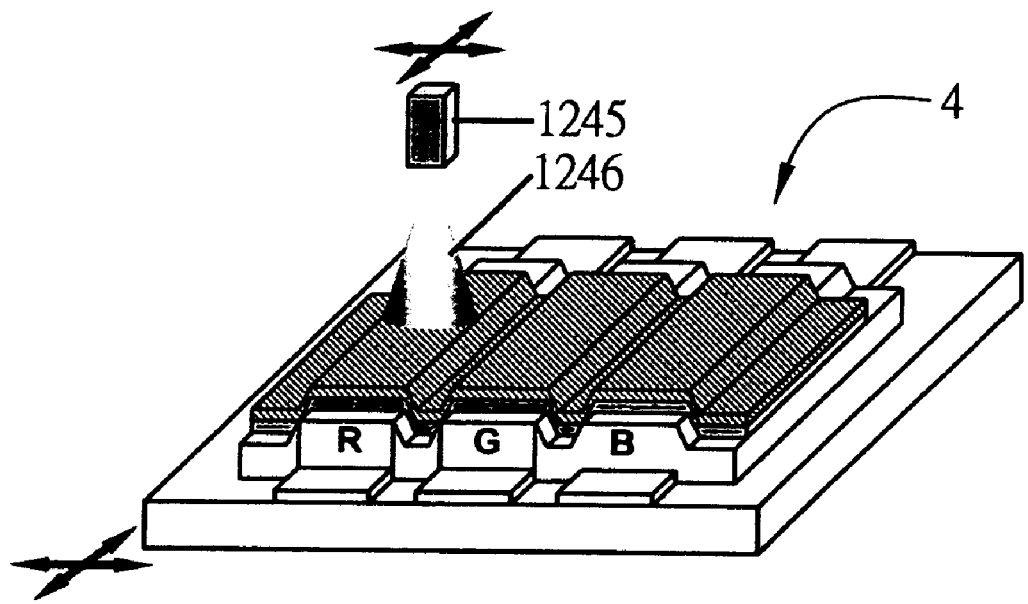

FIG. 16a and FIG. 16b illustrate the structure and the structural reconfiguration process of the reconfigurable organic light-emitting device by shining a light beam on a light-to-heat conversion layer to increase the temperature, which comprises a substrate 1240, a lower electrode 1241 of the organic light emitting device, a reconfigurable organic light-emitting structure 1242, an upper electrode 1243 of the organic light emitting device, a light-to-heat conversion layer 1244, a light source 1245 and a light beam 1246. Since an extra light-to-heat conversion layer 1244 is added to the upper electrode 1243 of the organic light emitting device, the incident light beam 1246 may thus be efficiently converted into heat for heating the device. One may adjust the intensity of the incident light-beam and the time and location of the light-beam so as to perform the heating process with different temperatures at different locations. The device (FIG. 16a) that originally has the same structure may thus be reconfigured into different structures via heating. The emission spectrum of the device is consequently changed (FIG. 16b).

Figure 17:
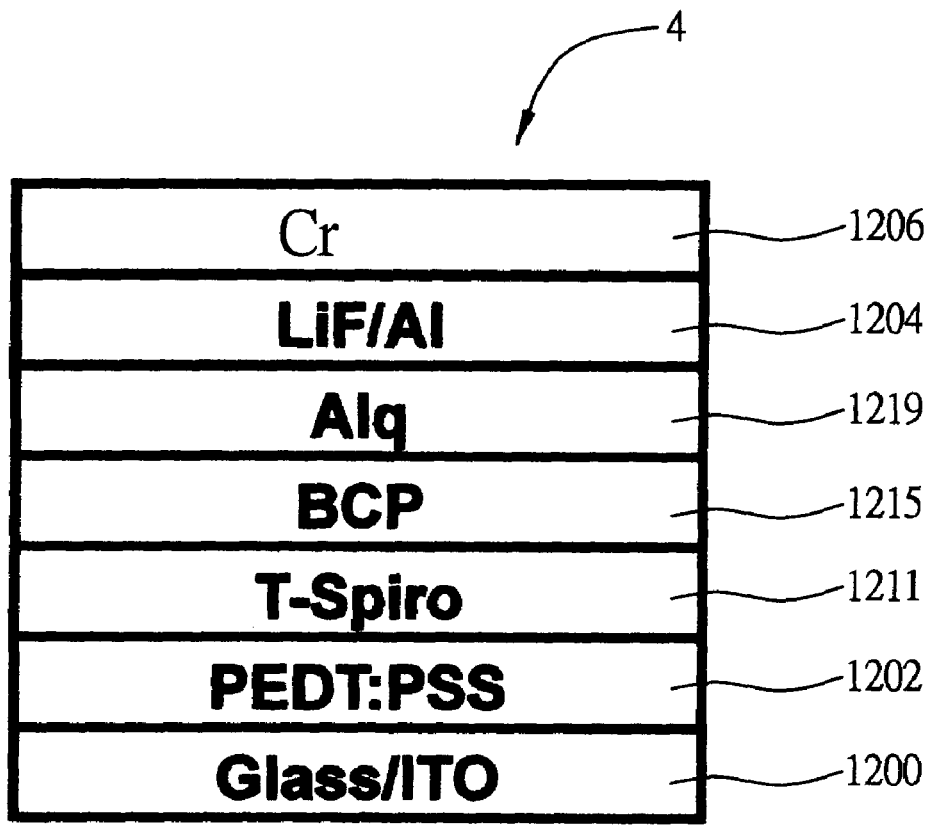
FIG. 17 is a cross-sectional diagram illustrating the reconfigurable organic light-emitting device having a light-to-heat conversion layer in accordance with the present invention.
Figure 18A:
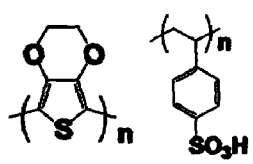
FIG. 18a to FIG. 18d are molecular structures of the organic materials used in the reconfigurable organic light-emitting device having a light-to-heat conversion layer in FIG. 17.
Figure 18B:
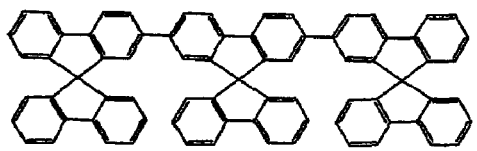
Figure 18C:
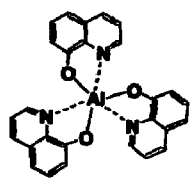
Figure 18D:
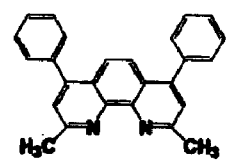

Example:

Referring now to FIG. 17, a cross-sectional view of a reconfigurable organic light-emitting device 4 having a light-to-heat conversion layer is illustrated. The reconfigurable organic light-emitting device 4 having a light-to-heat conversion layer comprises a glass substrate 1200 coated with ITO as a lower electrode, a layer of polyethylene dioxythiophene/polystyrene sulphonate (PEDT:PSS; see FIG18a) with a thickness of 300 Å deposited on the glass substrate 1200 coated with ITO as a hole injection layer 1202, a layer of ter(9,9'-spirobifluorene) (T-Spiro; see FIG. 18b) with a thickness of 400 Å deposited on the hole injection layer 1202 as a hole-transport/first light-emitting layer 1211, a layer of 2,9-dimethyl-4,7-diphenyl-1,10-phenanthroline (BCP; see FIG. 18d) with a thickness of 75 Å deposited on the hole-transport/first light-emitting layer 1211 as a hole-blocking/electron-transport layer 1215, a layer of tris-(8-hydroxyquinoline)aluminum (Alq; see FIG. 18c) with a thickness of 600 Å deposited on the hole-blocking/electron-transport layer 1215 as an electron-transport/second light-emitting layer 1219, a layer of lithium fluoride with a thickness of 5 Å and a layer of aluminum with a thickness of 1500 Å (LiF/Al) deposited on the electron-transport/second light-emitting layer 1219 as an electron injection layer and an upper electrode 1204, respectively, andfinally, a layer of chromium (Cr) with a thickness of 300 Å deposited on the electron injection layer and the upper electrode 1204 as a light-to-heat conversion layer 1206. The glass transition temperatures of the hole-transport/first light-emitting layer 1211, the hole-blocking/electron-transport layer 1215 and the electron-transport/second light-emitting layer 1219 are 237° C., 80° C. and 170° C., respectively.

Figure 19:
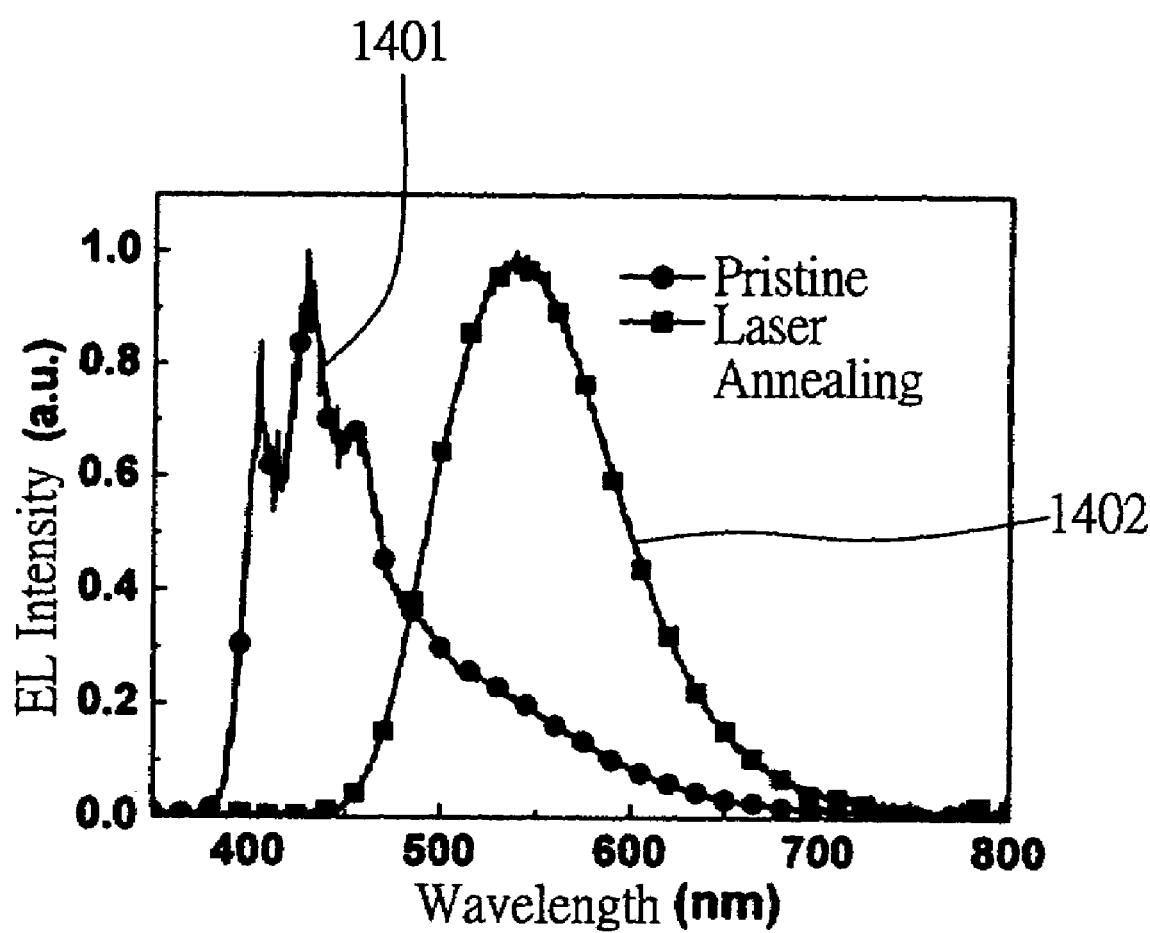
FIG. 19 is a diagram illustrating the light-emitting properties of the reconfigurable organic light-emitting device having a light-to-heat conversion layer in one particular embodiment of the present invention.

Applying now a bias voltage of about 10 volts on the reconfigurable organic light-emitting device 4 in this example, the reconfigurable organic light-emitting device 4 having a light-to-heat conversion layer then emits blue light. Next, shine the heating light-beam 1246 emitted from the heating light source 1245 on the light-to-heat conversion layer 1206 for 3 seconds so as to perform the heating process on the reconfigurable organic light-emitting device 4 having a light-to-heat conversion layer. In this example, the heating light source 1245 is an Nd:YAG laser, while the wavelength of the heating light-beam is 1024 nm and the power density of the heating light-beam is 1100 mW/mm$^2$. Meanwhile, the heated reconfigurable organic light-emitting device 4 having a light-to-heat conversion layer emits green light. Referring now to FIG. 19, wherein the normalized intensity—wavelength characteristics measured after applying a bias voltage of approximately 10 volts on the reconfigurable organic light-emitting device 4 having a light-to-heat conversion layer are illustrated. As shown in the figure, curve 1401 as represented by solid circles illustrates the characteristic spectrum measured after the reconfigurable organic light-emitting device 4 having a light-to-heat conversion layer of the present invention is fabricated, and before any conversion (heating) process, while curve 1402 as represented by solid squares illustrates the characteristic spectrum measured after the reconfigurable organic light-emitting device 4 having a light-to-heat conversion layer of the present invention is fabricated and the heating light-beam 1246 shined thereon for 3 seconds. By observing the curve 1401 and the curve 1402, one finds peaks of light-emitting intensity at the wavelength of approximately 430 nm for curve 1401 and at 540 nm for curve 1402. Thus the reconfigurable organic light-emitting device 4 having a light-to-heat conversion layer emits blue light before shining the heating light-beam thereon and emits green light after the heating beam has been shined thereon.

3. Applications in Multi-color or Full-Color Display:

By using the selective heating method of the reconfigurable organic light-emitting structure, a multi-color or full-color organic light emitting display may be fabricated. The following discussion is sequentially divided into three parts: fixed-pattern display apparatus, passive-matrix multi-color or full-color display apparatus, and active-matrix multi-color or full-color display apparatus.

Figure 20:
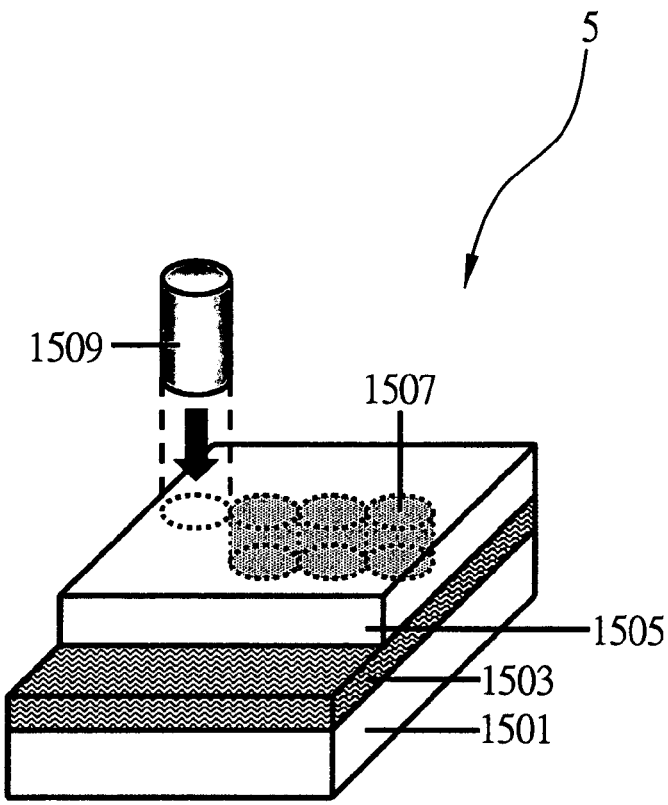
FIG. 20 is a perspective view of a fixed-pattern display apparatus employing the reconfigurable organic light-emitting device, wherein the display apparatus is heated via a patterned heating unit.

(1) Fixed-pattern Display Apparatus:

Referring to FIG. 20, a fixed-pattern display apparatus 5 employing the reconfigurable organic light-emitting device is illustrated. The fixed-pattern display apparatus 5 comprises a substrate 1501, a lower electrode 1503, a reconfigurable organic light-emitting layer 1505, and a patterned heating unit 1509. In this embodiment, the patterned heating unit 1509 is in contact with the reconfigurable organic light-emitting layer 1505. By heating the reconfigurable organic light-emitting layer 1505 with the patterned heating unit 1509, a plurality of heated regions 1507 are thus formed. Now, by applying a bias voltage of approximately 2 volts to 15 volts on the lower electrode 1503 and the upper electrode (not shown) of the reconfigurable organic light-emitting layer 1505, the plurality of heated regions may thus emit lights with different spectra from other areas. This makes a fixed-pattern display.

Figure 21:
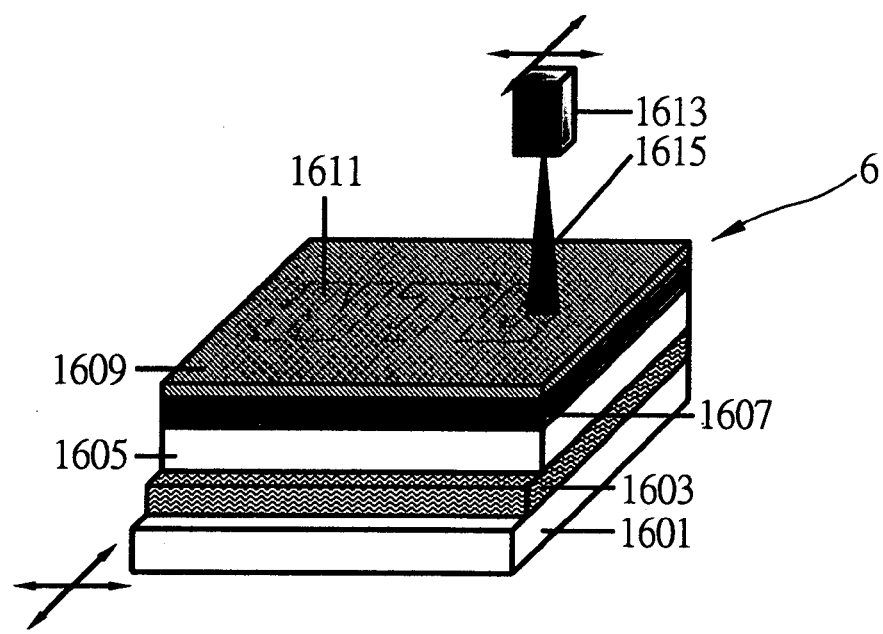
FIG. 21 is a perspective view of the fixed-pattern display apparatus employing the reconfigurable organic light-emitting device, wherein the display apparatus is heated via a light beam.

Referring to FIG. 21, another fixed-pattern display apparatus 6 of the present invention employing the reconfigurable organic light-emitting device is illustrated. The fixed-pattern display apparatus 6 comprises a substrate 1601, a lower electrode 1603, a reconfigurable organic light-emitting layer 1605, an upper electrode 1607, a light-to-heat conversion layer 1609, a light source 1603 and a light-beam 1615. By shining the light-beam 1615 emitted from the light source 1613 on the light-to-heat conversion layer 1609, the localized heating process may be performed on the light-to-heat conversion layer 1609. Meanwhile, a plurality of heated regions 1611 may be formed on the light-to-heat conversion layer 1609 by moving the light source 1613. The plurality of heated regions 1611 have the structure of the reconfigurable organic light emitting layer 1605 changed. Therefore, when applying a bias voltage of approximately 5 volts on the lower electrode 1603 and the upper electrode 1607 of the reconfigurable organic light-emitting layer 1605, the reconfigurable organic light-emitting layer 1605 emits lights with the patterns of heated regions 1611.

In this embodiment, the location of the light-to-heat conversion layer is only one example of possible locations. For other embodiments, the light-to-heat conversion layer may be fabricated at other locations, for example, above the upper electrode, beneath the lower electrode, within the structure of the reconfigurable organic light-emitting layer, or the upper and lower electrodes themselves, etc. It should be appreciated, therefore, the location of the light-to-heat conversion layer in this embodiment is not for limiting the possible locations but for illustrative purposes only.

Figure 22A:
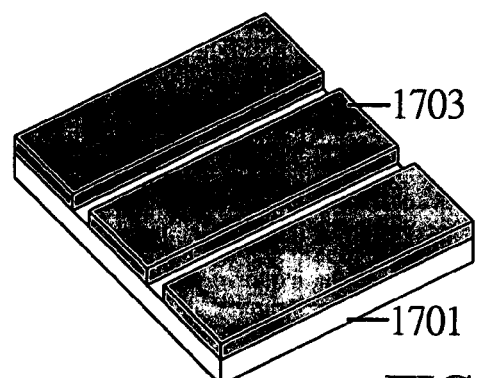
FIG. 22a to FIG. 22d are perspective views of a passive-matrix display apparatus employing the reconfigurable organic light-emitting device during steps of fabrication, wherein the display apparatus is heated using the device electrode as the resistive heating electrodes.
Figure 22B:
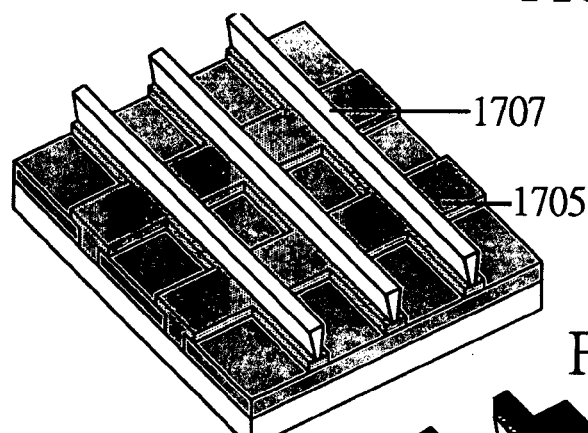

(2) Passive-Matrix Multi-Color/Full-Color Display Apparatus:

Referring to FIGS. 22a to 22d, the fabrication steps for a passive-matrix multi-color or full-color display apparatus employing the reconfigurable organic light-emitting device are illustrated. The passive-matrix display apparatus employs the built-in resistive heating. As shown in FIG. 22a, in order to employ the reconfigurable organic light-emitting device for fabricating the full- or multi-color passive-matrix display apparatus, a substrate 1701 is provided. The lower electrode 1703 is formed as shown in FIG. 22a by depositing a layer of lower electrode on the substrate by means of vacuum deposition, for example, and patterning the lower electrode by photolithography technique and the dry and/or wet etching process, Next, as shown in FIG. 22b, a patterned insulating structure on a portion of the substrate 1701 and above the lower electrode 1703 is fabricated by first deposition with vacuum deposition or spin coating, and then patterning the insulating layer by photolithography and dry and/or wet etching process, as shown in FIG. 22b. Then, an upper electrode separation layer is fabricated by vacuum deposition, for example, above the patterned insulating layer 1705, and by patterning the separation layer by photolithography and dry and/or wet etching process, as shown in FIG. 22b.

Figure 22C:
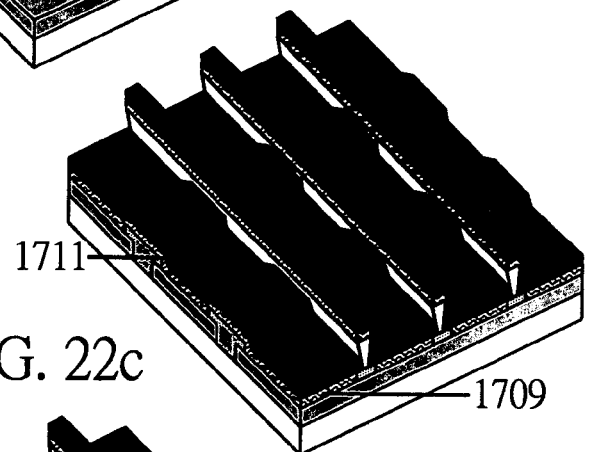
Figure 22D:
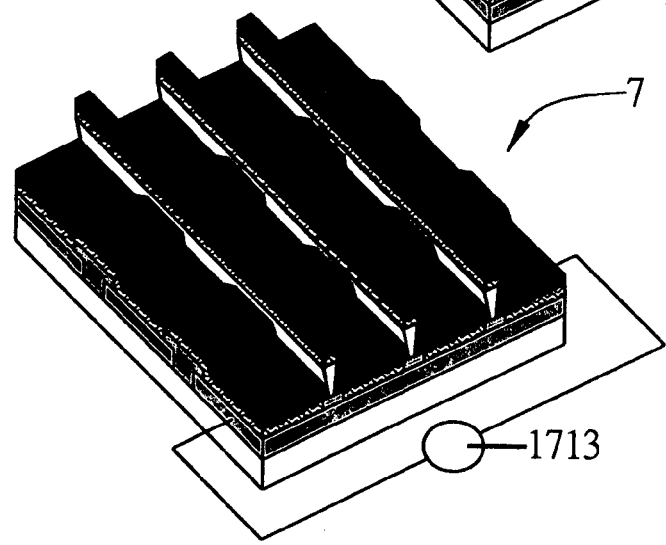

Next, as shown in FIG. 22c, a layer of reconfigurable organic light-emitting layer 1709 and a layer of upper electrode 1711 are fabricated by vacuum deposition, for example, on the structure as shown in FIG. 22b. Finally, as shown in FIG. 22d, by connecting the lower electrode 1703 with a heating power source 1713, the full- or multi-color passive-matrix display apparatus 7 is fabricated. In this particular embodiment, the lower electrode 1703 is also the built-in resistive heating electrode.

Figure 23A:
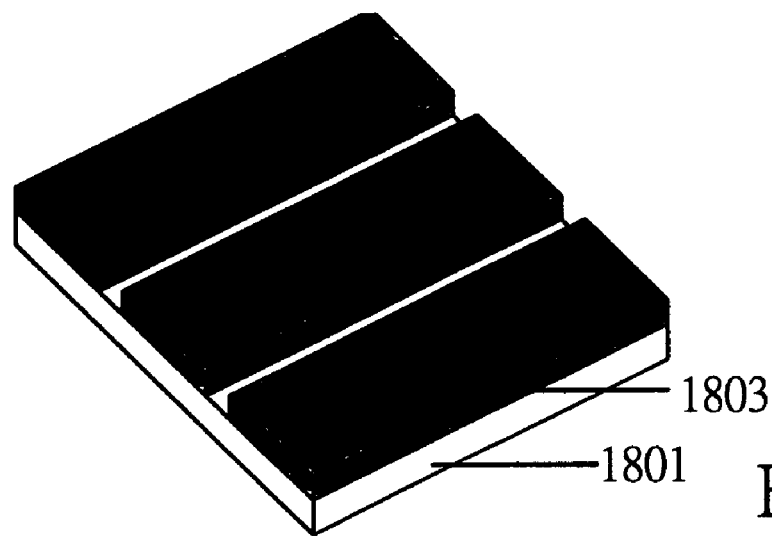
FIG. 23a to FIG. 23f are perspective views for the steps of fabricating the passive-matrix display apparatus employing the reconfigurable organic light-emitting device, wherein the display apparatus is heated using additional heating electrodes.

Now, referring to FIG. 23a to FIG. 23f, the steps for fabricating a full-color or multi-color passive-matrix display apparatus employing the reconfigurable organic light-emitting device are illustrated. The heating method of an extra heating electrode is adopted for this passive-matrix display apparatus. As shown in FIG. 23a, in order to employ the reconfigurable organic light-emitting device for fabricating the full or multi-color passive-matrix display apparatus, a substrate 1801 is provided. By fabricating a resist layer on the substrate by means of vacuum deposition or spin coating, and patterning the resist layer by means of photolithography technique accompanying with the dry and/or wet etching processes, the patterned resist 1803 is then formed, as shown in FIG. 23a.

Figure 23B:
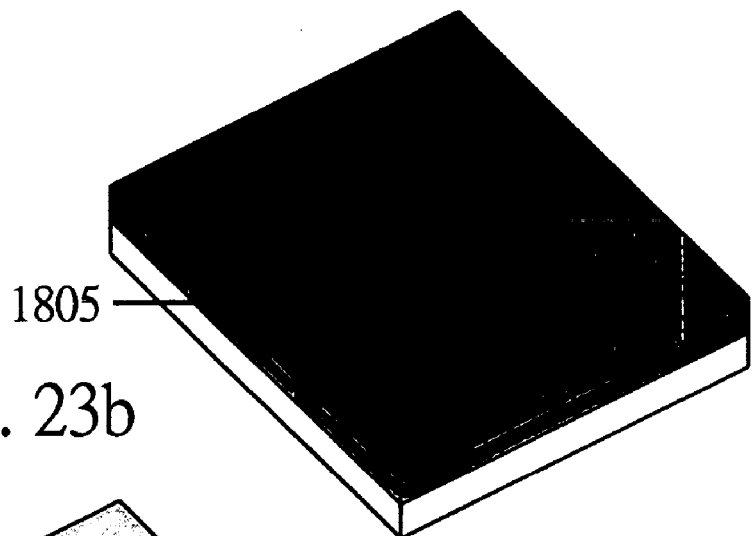
Figure 23C:
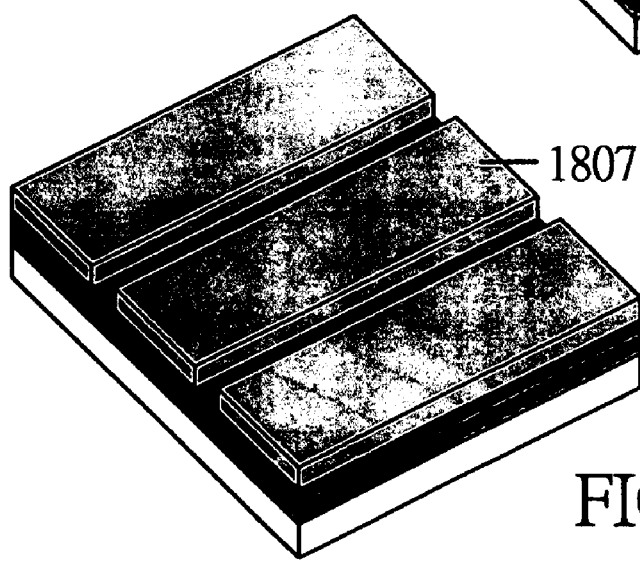
Figure 23D:
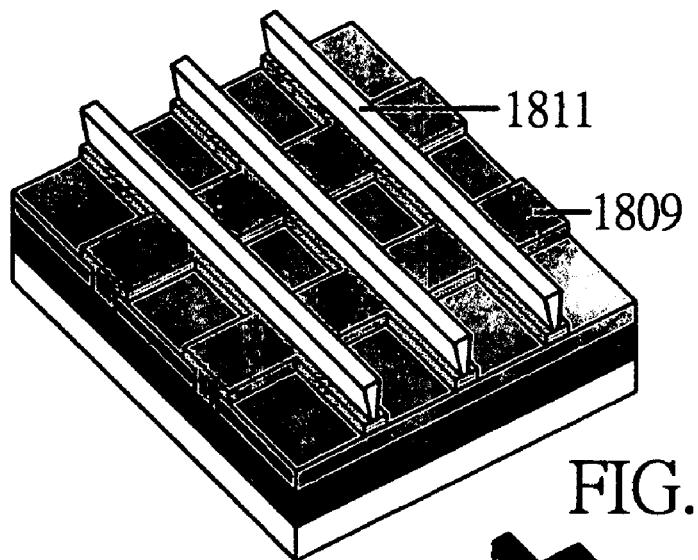

Next, as shown in FIG. 23b, a first insulating layer 1805 is fabricated on a portion of the substrate 1801 and above the patterned resist 1803 by vacuum deposition, for example. Then, by fabricating a layer lower electrode on the first insulating layer 1805, and patterning the lower electrode layer by photolithography technique accompanying the dry and/or wet etching process, the patterned lower electrode layer 1807 is thus formed, as shown in FIG. 23c. Then, by fabricating a second insulating layer on a portion of the first insulating layer 1805 and the patterned lower electrode 1807 by vacuum deposition, for example, and patterning the second insulating layer by photolithography technique accompanying the dry and/or wet etching processes, the patterned second insulating layer 1809 is thus formed, as shown in FIG. 23d. Moreover, an upper electrode separation layer is also fabricated, by vacuum deposition for example, above the second insulating layer 1809, and the upper electrode separation layer is patterned by photolithography technique accompanying dry and/or wet etching, such that the upper electrode isolating island 1811 are thus formed as shown in FIG. 23d.

Figure 23E:
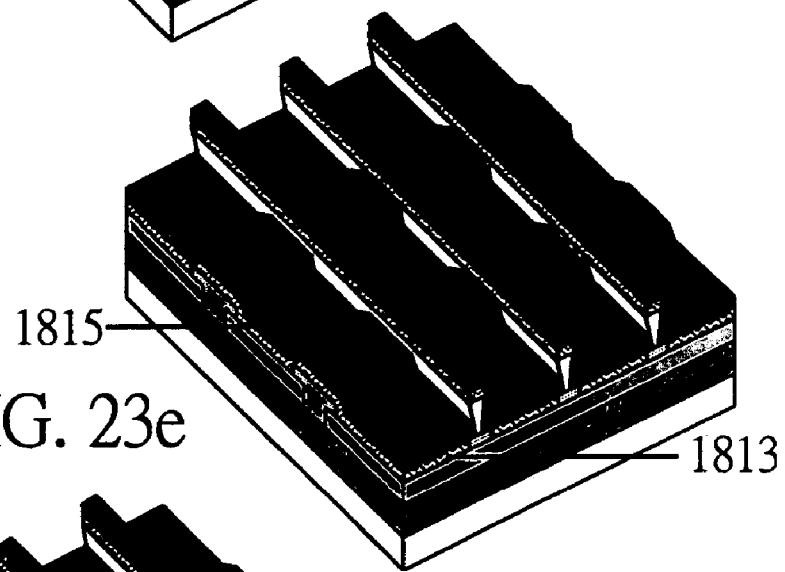
Figure 23F:
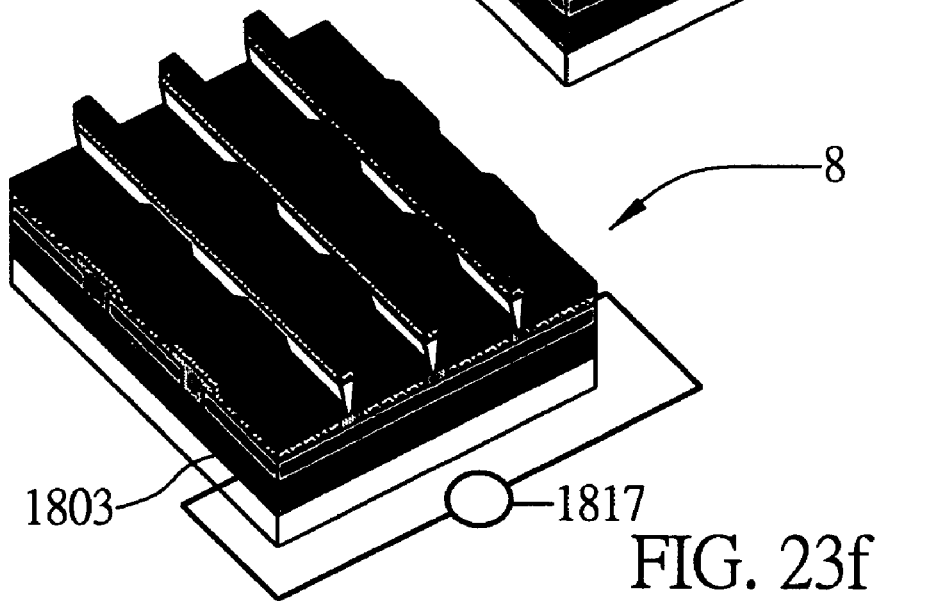

Next, as shown in FIG. 23e, a layer of reconfigurable organic light-emitting layer 1813 and a layer of upper electrode 1815 are fabricated by means of vacuum deposition, for example, above the structure as shown in FIG. 23b. Finally, as shown in FIG. 23f, the patterned resist 1803 is connected with a heating power source 1817, such that the full or multi-color passive-matrix display apparatus 8 is thus fabricated.

Figure 24A:
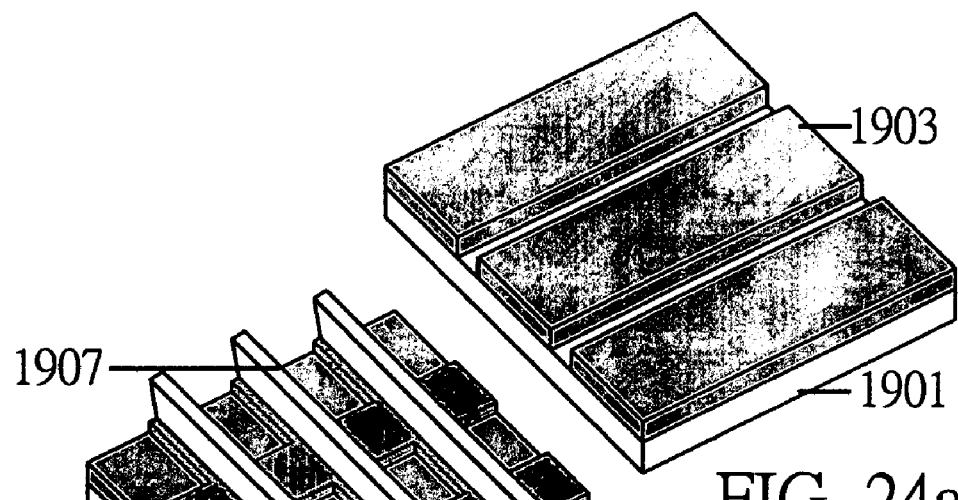
FIG. 24a to FIG. 24d are perspective views for the steps of fabricating the passive-matrix display apparatus employing the reconfigurable organic light-emitting device, wherein the display apparatus is heated via a light beam.

Now, referring to FIG. 24a to FIG. 24d, the steps for fabricating a full or multi-color passive-matrix display apparatus employing the reconfigurable organic light-emitting device are illustrated. The heating method of a light-beam is adopted for this passive-matrix display apparatus. As shown in FIG. 24a, in order to employ the reconfigurable organic light-emitting device for fabricating the full or multi-color passive-matrix display apparatus, a substrate 1801 is provided. By fabricating a lower electrode layer on the substrate by means of vacuum deposition, for example, and patterning the lower electrode layer by means of photolithography technique accompanying with the dry and/or wet etching processes, the lower electrode 1903 is then formed, as shown in FIG. 24a.

Figure 24B:
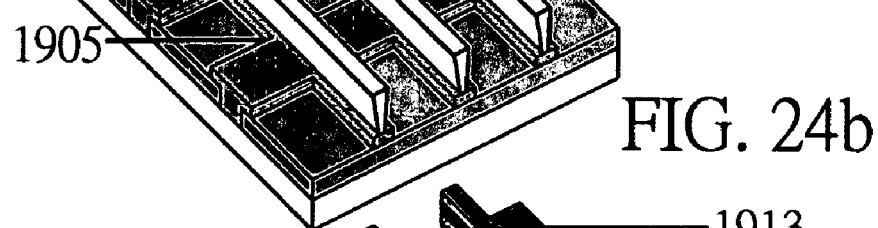

Next, as shown in FIG. 24b, by fabricating an insulating layer on a portion of the substrate 1901 and above the lower electrode 1903 by vacuum deposition or by spin coating, and patterning the insulating layer by photolithography technique accompanying the dry and/or wet etching processes, the patterned insulating layer 1905 is thus formed, as shown in FIG. 24b. Then, by fabricating an upper separation layer by vacuum deposition, for example, above the patterned insulating layer 1905, and patterning the upper separation layer by photolithography technique accompanying the dry and/or wet etching process, the upper electrode isolating islands 1907 are thus formed, as shown in FIG. 24b.

Figure 24C:
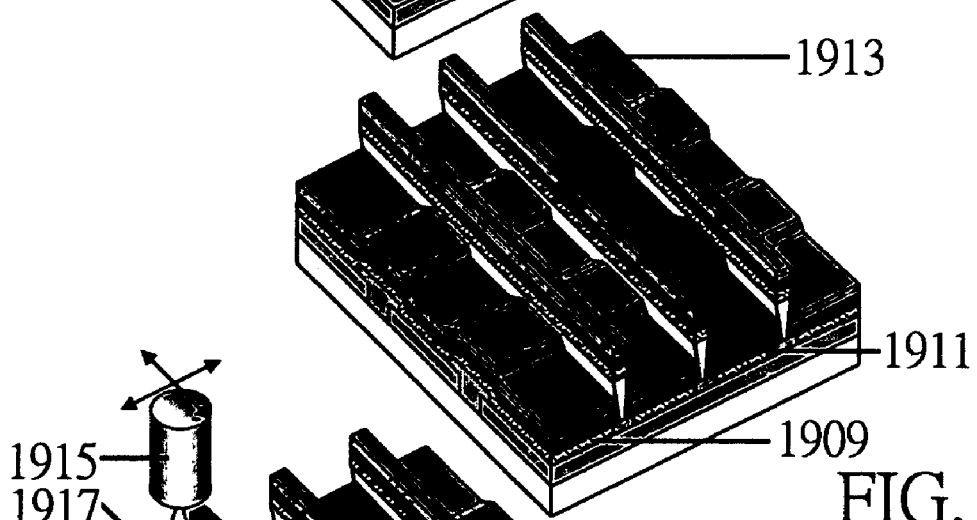
Figure 24D:
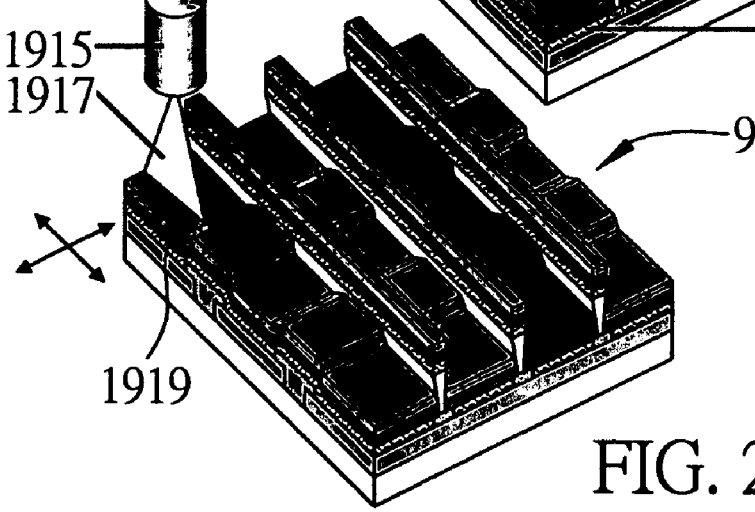

Next, as shown in FIG. 24c, a layer of reconfigurable organic light-emitting layer 1909, a layer of upper electrode 1911, and a layer of light-to-heat conversion layer 1913 are fabricated by vacuum deposition, for example, on the structure as shown in FIG. 24b. Finally, by moving the light-beam 1917 emitted from the light source 1915 to shine on each pixel 1919 of the light-to-heat conversion layer 1913, the structure corresponding to each pixel 1919 of the reconfigurable organic light-emitting layer 1909 is thus changed. Therefore, when a bias voltage of approximately 10 volts is applied on the lower electrode 1903 and the upper electrode 1911 of the reconfigurable organic light-emitting layer 1909, the reconfigurable organic light-emitting thus emits lights corresponding to their particular spectra, and the pattern is thus displayed. This completes the fabrication of a full or multi-color passive-matrix display apparatus 9. In this embodiment, an auxiliary electrode, disclosed in the Republic of China Patent No. 521535, may be added at a side of the upper electrode and the lower electrode for enhancing the side conduction capability.

In this embodiment, the location of the light-to-heat conversion layer is only an example of possible locations. For other particular embodiments, the light-to-heat conversion layer may be fabricated at other locations, for example, above the upper electrode, beneath the lower electrode, within the structure of the reconfigurable organic light-emitting layer, or the upper and lower electrodes themselves, etc. Therefore, it is appreciated that the location of the light-to-heat conversion layer in this embodiment is not for limiting the possible locations but is for illustrative purposes only.

In summary, the full-color or multi-color passive-matrix display apparatus of the present invention not only avoids the limitation of device size and display resolution of the shadow mask method, but also reduces the fabrication steps. Also, the consumption of material may be largely reduced and the yield may be enhanced.

Figure 25:
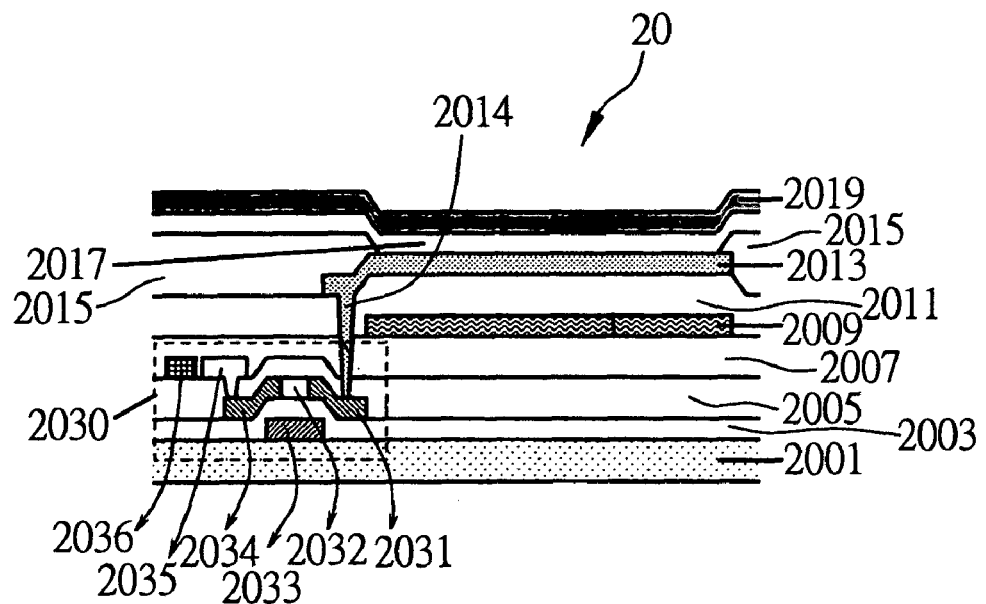
FIG. 25 is a cross-sectional view of an active-matrix display apparatus employing the reconfigurable organic light-emitting device, wherein the display apparatus is heated using additional heating electrodes.

(3) Active-Matrix Multi-Color/Full-Color Display Apparatus:

Referring to FIG. 25, a cross-sectional view of the full-color or multi-color active-matrix display apparatus 20 employing the reconfigurable organic light-emitting device is illustrated. The heating method using built-in resistive heating electrode is adopted in this active-matrix display apparatus 20. The active-matrix display apparatus comprises a substrate 2001, a first insulating layer 2003, a second insulating layer 2005, a third insulating layer 2007, a resistive layer 2009, a fourth insulating layer 2011, a lower electrode 2013, a fifth insulating layer 2015, a reconfigurable organic light-emitting layer 2017, an upper electrode and a transistor circuit 2030. The transistor circuit is a field effect transistor circuit, which further comprises a source 2031, a channel 2032, a gate 2033, a drain 2034, a driving line 2035 and a data line 2036. As shown in the figure, the gate 2033 is disposed on the substrate 2001; the first insulating layer 2003 is disposed on the substrate 2001 and the gate 2033; the source 2031, the channel 2032, and the drain 2034 are disposed respectively above the first insulating layer 2003 corresponding to the gate 2033; the second insulating layer 2005 is disposed above the first insulating layer 2003, the source 2031, the channel 2032 and the drain 2034; the data line 2036 and the driving line 2035 are disposed on the second insulating layer 2005, and the driving line 2035 and the drain 2034 are electrically connected; the third insulating layer 2007 is disposed above the data line 2036, the driving line 2035, and the second insulating layer; the resistive layer 2009 is deposited on the third insulating layer 2007; the fourth insulating layer 2011 is disposed on the resistive layer 2009 and on the exposed portion of the third insulating layer 2007 not covered by the resistive layer 2009; the lower electrode 2013 is deposited on the fourth insulating layer 2011 at a location corresponding to the resistive layer 2009, and the lower electrode 2013 has a protruding portion 2014 which penetrates through the forth insulating layer 2011, the third insulating layer 2007 and the second insulating layer 2005 and is electrically connected with the source 2031; the fifth insulating layer 2015 is disposed on the forth insulating layer 2011, covering a portion of the lower electrode 2013; the reconfigurable organic light-emitting layer 2017 is deposited on the lower electrode 2013 and the fifth insulating layer 2015; finally, the upper electrode 2019 is deposited on the reconfigurable organic light-emitting layer. As such, the fabrication of the active-matrix display apparatus 20 incorporating built-in resistive heating electrodes is completed. It is noted that the transistor circuit 2030 of the present embodiment is integrated into the active-matrix multi-color/full-color display apparatus. Furthermore, the transistor circuit 2030 may be an N channel or a P channel field effect transistor circuit.

Figure 26:
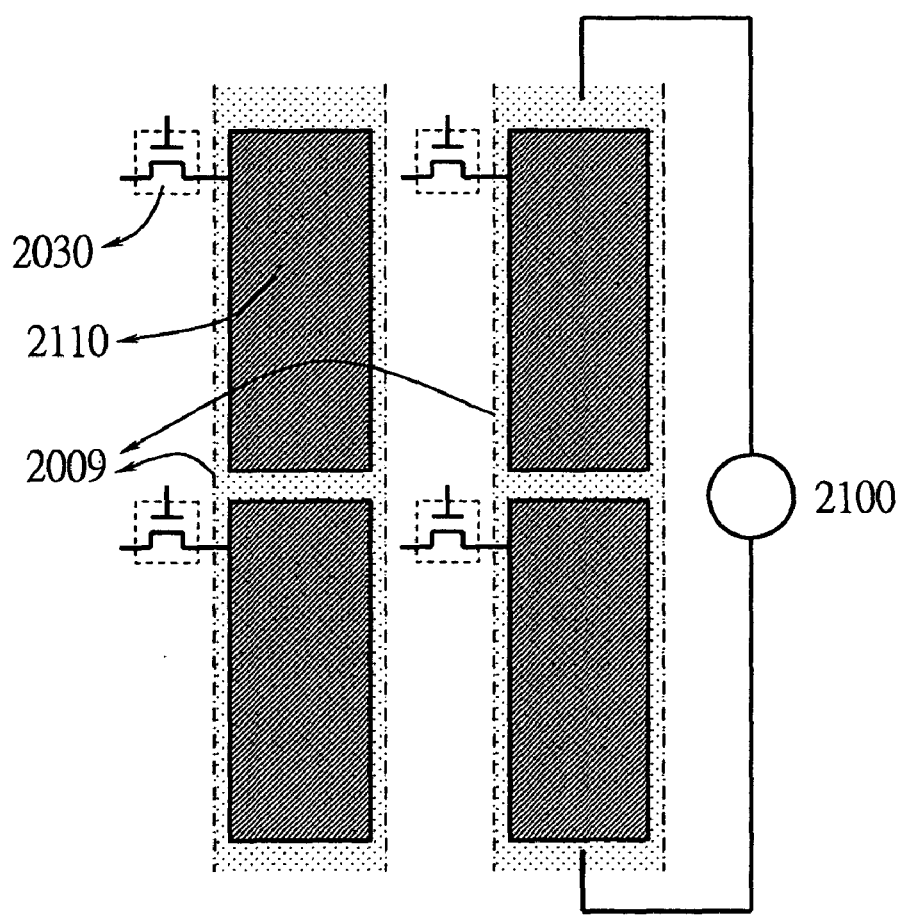
FIG. 26 is a schematic diagram of the spatial arrangement in the active-matrix display apparatus employing the reconfigurable organic light-emitting device.

Referring now to FIG. 26, the relative spatial arrangement of the active-matrix display apparatus 20 as shown in FIG. 25 is illustrated. The bias voltage applied on the upper electrode 2019 and the lower electrode 2013, shown in FIG. 25, is controlled by the transistor circuit 2030, so as to determine whether the effective light-emitting area 2110 emits light or not. Moreover, a certain current may be applied on the resistive layer 2009 via the heating power source 2100 to perform heating and structural reconfiguration of the reconfigurable OLED and to control the emission spectrum of the effective light-emitting region 2110.

Figure 27:
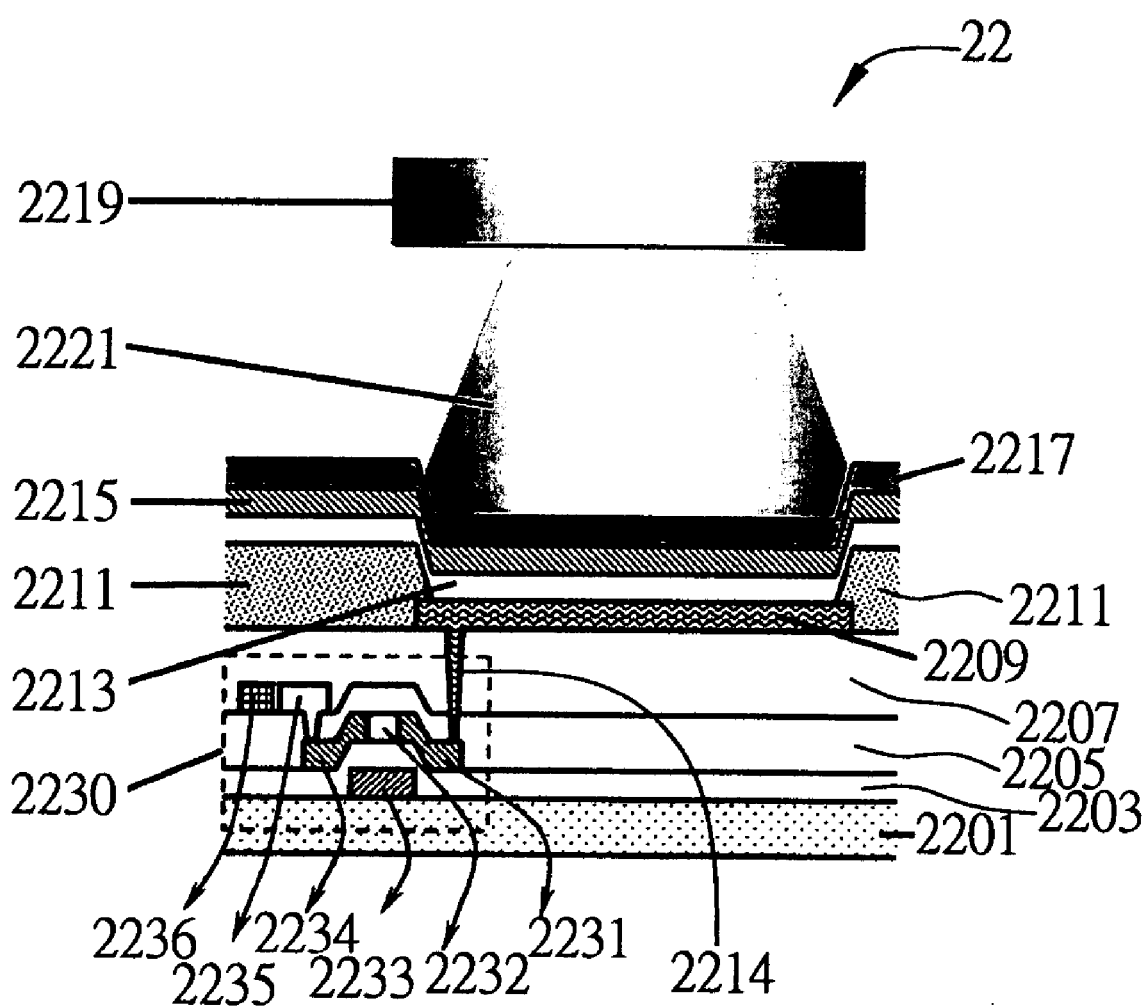
FIG. 27 is a cross-sectional view of the active-matrix display apparatus fabricated by employing the reconfigurable organic light-emitting device, wherein the display apparatus is heated via a light beam.

Now, referring to FIG. 27, a cross-sectional view of the full or multi-color active-matrix display apparatus 22 employing the reconfigurable organic light-emitting device is illustrated. The heating with a light beam is adopted in this active-matrix display apparatus 22. The active-matrix display apparatus 22 comprises a substrate 2201, a first insulating layer 2203, a second insulating layer 2205, a third insulating layer 2207, a lower electrode 2209, a fourth insulating layer 2211, a reconfigurable organic light-emitting structure 2213, an upper electrode 2215, a light-to-heat conversion layer 2217 and a transistor circuit 2230. The transistor circuit 2230 further comprises a source 2231, a channel 2232, a channel 2233, a drain 2234, a driving line 2235 and a data line 2236. As shown in the figure, the channel 2233 is disposed on the substrate 2201; the first insulating layer 2203 is disposed on the substrate and the channel 2233; the source 2231, the channel 2232 and the drain 2234 are disposed on their respective location on the first insulating layer 2203 corresponding to the location of the channel 2233; the second insulating layer 2205 is disposed on the first insulating layer 2203, and above the source 2231, the channel 2232 and the drain 2234; the data line 2236 and the driving line 2235 are disposed on the second insulating layer 2205, while the driving line 2235 and the drain 2234 are electrically connected with each other; the third insulating layer 2207 is disposed above the data line 2236, the driving line 2235 and the second insulating layer 2205; the lower electrode 2209 is deposited on the third insulating layer 2207, and the lower electrode 2209 has a protruding portion 2214 which penetrates through the third insulating layer 2207 and the second insulating layer 2205, and is electrically connected with the source 2231; the fourth insulating layer 2211 is disposed on the third insulating layer covering a portion of the lower electrode 2209; the reconfigurable organic light-emitting layer 2213 is disposed on the lower electrode 2209 and the fourth insulating layer 2211; the upper electrode 2215 is deposited on the reconfigurable organic light-emitting layer 2213; finally, a light-to-heat conversion layer is disposed on the upper electrode 2215. By shining the light beam 2221 emitted from the light source 2219 on the light-to-heat conversion layer 2217, the reconfigurable organic light-emitting layer 2213 may be heated so as to control its emission spectrum. Moreover, the bias voltage applied on the upper electrode 2215 and the lower electrode 2209 may be controlled by using the transistor circuit 2230, so as to determine whether the effective reconfigurable light-emitting layer 2213 emits light or not. As such, the fabrication of an active-matrix display apparatus 20 by employing the heating process of a light-beam is thus completed. It is noted that the transistor circuit 2230 of the present embodiment is integrated into the active-matrix multi-color/full-color display apparatus. Besides, the transistor circuit 2230 may be an N channel or a P channel field effect transistor circuit. Furthermore, the location of the light-to-heat conversion layer 2217 is not limited to be above the upper electrode 2215, but it may also be located, for example, beneath the upper electrode 2215, above the lower electrode 2209 or beneath the lower electrode 2209, etc.

What is disclosed above is only the preferred embodiments of the present invention. The scope of the present invention is thus not limited to the above. The technical content of the present invention is defined, in its broadest sense, in the following claims. Any alternation or modification exactly the same or equivalent to the following claims by one of ordinarily skilled in the art is considered to be within the spirit and scope of the present invention.

What is claimed is:

1. A reconfigurable organic light-emitting device, comprising:
    at least two organic light-emitting layers; and
    at least one high-energy-gap carrier-blocking layer, formed between each of the organic light-emitting layers;
    wherein the organic light-emitting layers and the high-energy-gap carrier-blocking layer can be heated to induce the inter-diffusion process, so as to change the structure of the reconfigurable organic light-emitting device and emit light of different spectra in different structures.

2. The organic light-emitting device as recited in claim 1, further comprising an upper electrode and a lower electrode sandwiching the organic light-emitting layers and the high-energy-gap carrier-blocking layer, wherein by applying a bias voltage thereon, the reconfigurable organic light-emitting device may emit lights.

3. The organic light-emitting device as recited in claim 2, further comprising a light-to-heat conversion layer adjacent to at least one of the organic light-emitting layers, wherein by shining a light-beam thereon, the reconfigurable organic light-emitting device may be heated.

4. The organic light-emitting device as recited in claim 2, further comprising a built-in resistive heating electrode adjacent to at least one of the organic light-emitting layers, wherein by applying a current thereon, the reconfigurable organic light-emitting device may be heated.

5. The organic light-emitting device as recited in claim 2, further comprising an external heating source adjacent to at least one of the organic light-emitting layers.

6. The organic light-emitting device as recited in claim 5, wherein the external heating source is a patterned resistive heating electrode, wherein by applying a current thereon, the reconfigurable organic light-emitting device may be heated.

7. The organic light-emitting device as recited in claim 4, wherein the built-in resistive heating electrode is a patterned resistive conductor.

8. The organic light-emitting device as recited in claim 3, wherein the light-beam is a laser beam.

9. The organic light-emitting device as recited in claim 1, wherein a glass transition temperature of the high-energy-gap carrier-blocking layer is smaller than the glass transition temperatures of the organic light-emitting layers.

10. The organic light-emitting device as recited in claim 1, wherein the emission spectrum of the reconfigurable organic light-emitting device is one of the characteristic spectra of the at least two organic light-emitting layers, and when the structure of the reconfigurable organic light-emitting device is changed, the emission spectrum of the reconfigurable organic light-emitting device changes from the characteristic spectrum of one layer of the at least two organic light-emitting layers to that of another layer of the at least two organic light-emitting layers.

* * * * *